United States Patent
Lister

(10) Patent No.: US 9,731,539 B2
(45) Date of Patent: Aug. 15, 2017

(54) SECURITY DEVICES

(71) Applicant: DE LA RUE INTERNATIONAL LIMITED, Viables, Basingstoke (GB)

(72) Inventor: Adam Lister, Andover (GB)

(73) Assignee: DE LA RUE INTERNATIONAL LIMITED, Basingstoke, Hampshire (GB)

( * ) Notice: Subject to any disclaimer, the term of this patent is extended or adjusted under 35 U.S.C. 154(b) by 267 days.

(21) Appl. No.: 14/351,298

(22) PCT Filed: Oct. 11, 2012

(86) PCT No.: PCT/GB2012/052522
§ 371 (c)(1),
(2) Date: Apr. 11, 2014

(87) PCT Pub. No.: WO2013/054119
PCT Pub. Date: Apr. 18, 2013

(65) Prior Publication Data
US 2014/0312606 A1    Oct. 23, 2014

(30) Foreign Application Priority Data
Oct. 11, 2011 (GB) .................................. 1117530.4

(51) Int. Cl.
*B42D 25/324* (2014.01)
*B42D 25/00* (2014.01)
(Continued)

(52) U.S. Cl.
CPC ........... *B42D 25/351* (2014.10); *B41M 3/148* (2013.01); *B42D 25/00* (2014.10); *B42D 25/29* (2014.10);
(Continued)

(58) Field of Classification Search
CPC .............. B42D 25/324; B42D 2033/29; B42D 2035/30
See application file for complete search history.

(56) References Cited

U.S. PATENT DOCUMENTS 3,930,924 A * 1/1976 Oka ....................... B42D 25/00
283/107
4,080,208 A   3/1978 Bialczak
(Continued)

FOREIGN PATENT DOCUMENTS

| CA | 2 490 834 A1 | 5/1997 |
| CA | 2 577 522 A1 | 4/2006 |

(Continued)

OTHER PUBLICATIONS

Aug. 4, 2015 Office Action issued in European Patent Application No. 12 783 648.4.
(Continued)

*Primary Examiner* — Kyle Grabowski
(74) *Attorney, Agent, or Firm* — Oliff PLC

(57) ABSTRACT

A method and security device, including: a semi-transparent layer exhibiting a first pattern of regions having high optical density and/or raised surface profile relative to layer intervening regions; and a color layer exhibiting a second pattern of elements of at least one color. First and second patterns partially overlap and are configured so the device, appearance varies at different viewing angles. First pattern has color layer following the contours of raised regions. Security device includes: a photosensitive film exhibiting pattern of regions of relatively high and low optical density, the pattern arising from photosensitive film exposure to radiation of a responsive predetermined wavelength from the photosensitive film; and a color layer overlapping the pattern exhibited by photosensitive film, which exhibits increase in optical density upon radiation exposure of a predetermined wave-
(Continued)

length and concurrent or subsequent heating. Increases in optical density being due to the bubbles formation within the photosensitive film.

26 Claims, 11 Drawing Sheets

(51) Int. Cl.
  *B42D 25/351* (2014.01)
  *B41M 3/14* (2006.01)
  *G03C 5/08* (2006.01)
  *G03C 5/60* (2006.01)
  *B42D 25/29* (2014.01)
  *G03F 7/20* (2006.01)
  *B42D 25/342* (2014.01)

(52) U.S. Cl.
  CPC .......... *B42D 25/324* (2014.10); *G03C 5/08* (2013.01); *G03C 5/60* (2013.01); *G03F 7/20* (2013.01); *B42D 25/342* (2014.10); *B42D 2033/14* (2013.01); *B42D 2033/24* (2013.01); *B42D 2035/16* (2013.01); *B42D 2035/20* (2013.01); *B42D 2035/24* (2013.01); *B42D 2035/44* (2013.01)

(56) References Cited

U.S. PATENT DOCUMENTS

| | | | |
|---|---|---|---|
| 4,152,156 A | 5/1979 | Voisin et al. | |
| 4,506,916 A * | 3/1985 | Kuhl | B42D 25/425 283/111 |
| 4,507,346 A * | 3/1985 | Maurer | B42D 25/41 283/107 |
| 4,652,015 A | 3/1987 | Crane | |
| 5,005,872 A * | 4/1991 | Lass | B42D 25/00 283/117 |
| 5,298,922 A * | 3/1994 | Merkle | B42D 25/43 283/85 |
| 5,582,103 A | 12/1996 | Tanaka et al. | |
| 6,004,656 A * | 12/1999 | Gosselin | G09F 7/00 428/209 |
| 6,176,521 B1 * | 1/2001 | Mancuso | B42D 15/00 283/85 |
| 6,494,491 B1 | 12/2002 | Zeiter et al. | |
| 6,659,508 B1 | 12/2003 | Nemeth et al. | |
| 7,630,954 B2 * | 12/2009 | Adamczyk | B42D 25/29 283/91 |
| 2004/0234816 A1 | 11/2004 | Azakami et al. | |
| 2005/0118537 A1 | 6/2005 | Lutz et al. | |
| 2005/0240549 A1 | 10/2005 | Adamczyk et al. | |
| 2007/0241553 A1 | 10/2007 | Heim et al. | |
| 2007/0246932 A1 | 10/2007 | Heine et al. | |
| 2008/0042427 A1 | 2/2008 | Muke | |
| 2008/0224463 A1 * | 9/2008 | Egli | B42D 25/00 283/86 |
| 2010/0308570 A1 | 12/2010 | Heim | |
| 2011/0079997 A1 | 4/2011 | Heim | |
| 2012/0187673 A1 * | 7/2012 | Stewart | B42D 25/29 283/72 |

FOREIGN PATENT DOCUMENTS

| | | |
|---|---|---|
| CA | 2 642 330 A1 | 8/2007 |
| CA | 2 667 081 A1 | 5/2008 |
| DE | 44 07 622 A1 | 9/1995 |
| DE | 102 43 863 A1 | 2/2004 |
| EP | 0 000 425 A1 | 1/1979 |
| EP | 0 059 056 A1 | 9/1982 |
| EP | 0 803 774 A1 | 10/1997 |
| EP | 0 860 298 A2 | 8/1998 |
| EP | 1 398 174 A1 | 3/2004 |
| EP | 1 897 700 A2 | 3/2008 |
| EP | 2 088 004 A1 | 8/2009 |
| GB | 2480227 A | 11/2011 |
| JP | A-2005-246746 | 9/2005 |
| WO | WO 83/00659 A1 | 3/1983 |
| WO | WO 94/00298 A1 | 1/1994 |
| WO | WO 94/27254 A1 | 11/1994 |
| WO | WO 95/10419 A1 | 4/1995 |
| WO | WO 95/10420 A1 | 4/1995 |
| WO | WO 00/39391 A1 | 7/2000 |
| WO | 01/00426 A1 | 1/2001 |
| WO | WO 03/054297 A2 | 7/2003 |
| WO | WO 03/095188 A2 | 11/2003 |
| WO | 2005/047013 A2 | 5/2005 |
| WO | 2005/052650 A2 | 6/2005 |
| WO | WO 2005/052650 A2 | 6/2005 |
| WO | WO 2005/106601 A2 | 11/2005 |
| WO | WO 2006/034780 A1 | 4/2006 |
| WO | WO 2006/076616 A2 | 7/2006 |
| WO | WO 2008/061930 A1 | 5/2008 |
| WO | WO 2011/008287 A1 | 1/2011 |
| WO | 2011/012893 A2 | 2/2011 |
| WO | 2011/051670 A2 | 5/2011 |
| WO | WO 2011/051670 A2 | 5/2011 |
| WO | WO 2011/107782 A1 | 9/2011 |
| WO | WO 2011/107793 A1 | 9/2011 |

OTHER PUBLICATIONS

Jan. 16, 2013 Search Report issued in Great Britain Application No. GB1218251.5.
May 16, 2013 Search Report issued in Great Britain Application No. GB1218251.5.
May 24, 2012 Search Report issued in Great Britain Application No. GB1117530.4.
Jan. 27, 2012 Search Report issued in Great Britain Application No. GB 1117530.4.
Mar. 21, 2013 International Search Report issued in International Application No. PCT/GB2012/052522.
Mar. 21, 2013 Written Opinion of the International Searching Authority issued in International Application No. PCT/GB2012/052522.
Rudolf L. Renesse, Optical Document Security, Third Edition, p. 85, 2004.

* cited by examiner

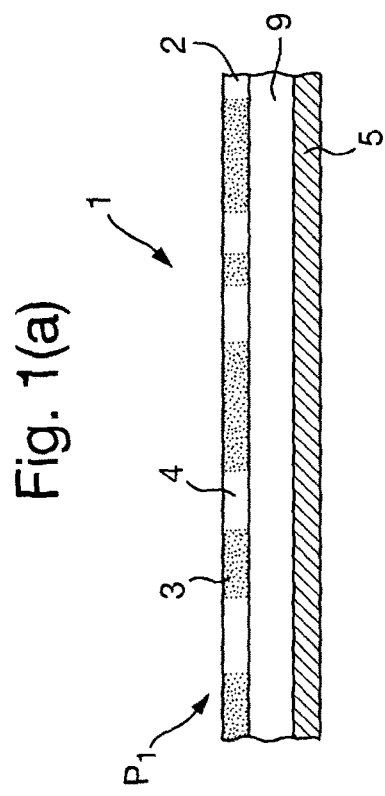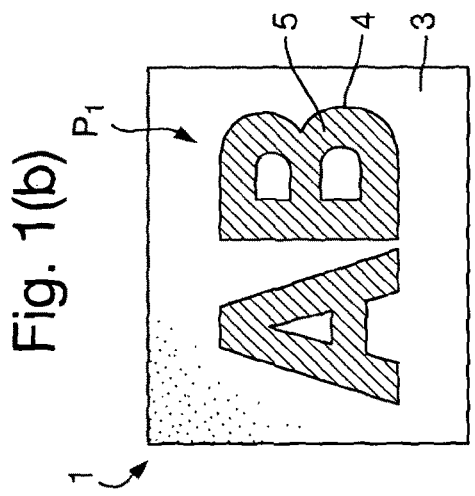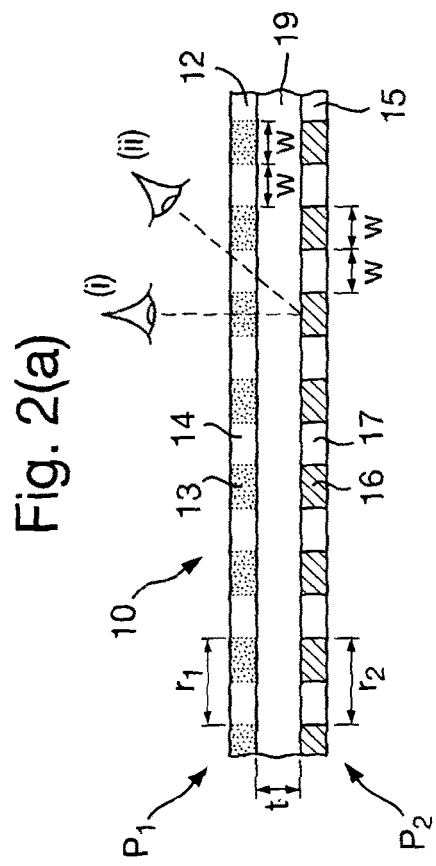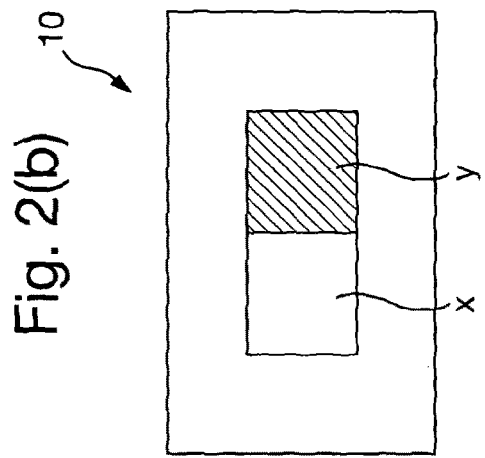

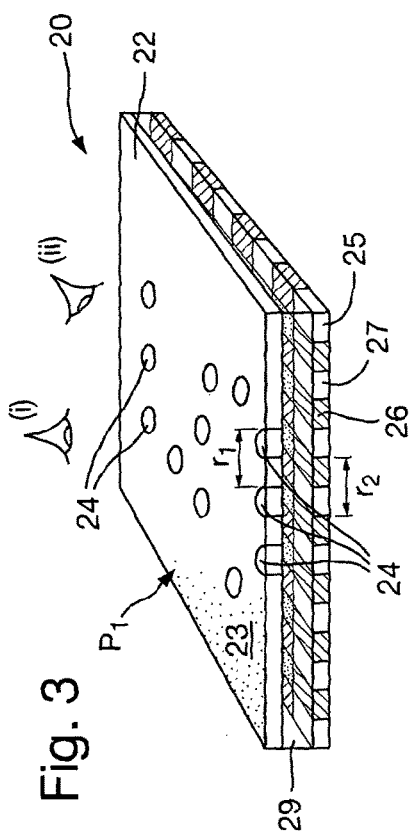
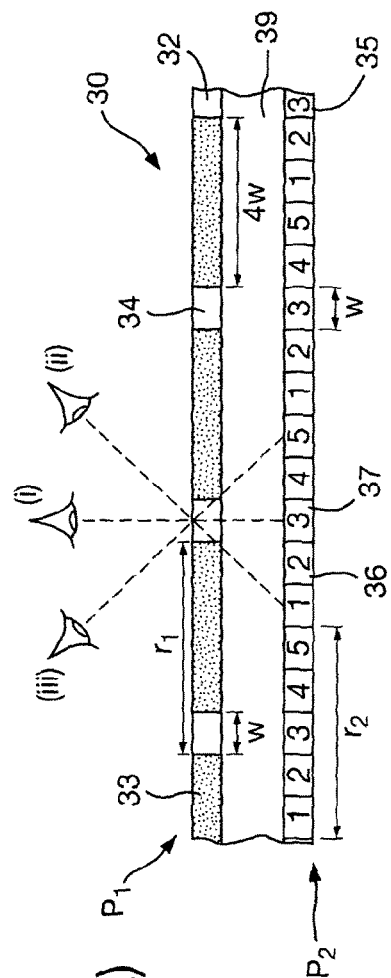
Fig. 3
Fig. 4(a)
Fig. 4(b)

SECURITY DEVICES

This invention relates to security devices for objects of value, particularly documents of value such as bank notes, cheques, passports, ID cards and the like. Methods of manufacturing such security devices are also provided.

Objects of value, and particularly documents of value such as banknotes, cheques, passports, identification documents, certificates and licenses, are frequently the target of counterfeiters and persons wishing to make fraudulent copies thereof and/or changes to any data contained therein. Typically such objects are provided with a number of visible security devices for checking the authenticity of the object. Examples include features based on one or more patterns such as microtext, fine line patterns, latent images, venetian blind devices, lenticular devices, moiré interference devices and moiré magnification devices, each of which generates a secure visual effect. Other known security devices include holograms, watermarks, embossings, perforations and the use of colour-shifting or luminescent/fluorescent inks. Common to all such devices is that the visual effect exhibited by the device is extremely difficult, or impossible, to copy using available reproduction techniques such as photocopying. Security devices exhibiting non-visible effects such as magnetic materials may also be employed.

There is a constant need to develop new security devices and visual effects in order to stay ahead of would-be counterfeiters.

In accordance with a first aspect of the present invention, a security device comprises:
  an at least semi-transparent layer exhibiting a first pattern of integral regions having a high optical density relative to intervening regions of the layer; and
  a colour layer exhibiting a second pattern of elements of at least one colour;
  wherein the first and second patterns at least partially overlap one another and are configured such that, when the device is viewed from at least one side, the first and second patterns co-operate to generate an optically variable effect whereby the appearance of the device varies at different viewing angles.

In accordance with a second aspect of the invention, a security device is provided, comprising:
  an at least semi-transparent layer exhibiting a first pattern of integral regions having a raised surface profile relative to intervening regions of the layer; and
  a colour layer arranged to follow the contours of the regions and exhibiting a second pattern of elements of at least one colour;
  wherein the first and second patterns at least partially overlap one another and are configured such that, when the device is viewed from at least one side, the first and second patterns co-operate to generate an optically variable effect whereby the appearance of the device varies at different viewing angles.

By "security device" we mean a feature which it is not possible to reproduce accurately by taking a visible light copy, e.g. through the use of standardly available photocopying or scanning equipment. Optically variable effects (i.e. effects whereby the appearance of the device, such as its colour, changes at different viewing angles) have previously been generated through the interaction of two overlapping patterns of visible and/or raised elements. Conventionally, where both patterns comprise visible elements, the two patterns are formed for example by printing on either side of a transparent layer or onto two transparent layers which are then assembled together. The present inventors have found that improved results can be attained where the first pattern is instead formed by modified regions of an otherwise at least (visually) semi-transparent layer. By arranging the regions to be of increased optical density, the first pattern is rendered visible and can interact with the second pattern to generate effects akin or superior to those of conventional devices, as discussed further below.

Nonetheless upon inspection it is possible to distinguish a device formed in this way from a conventional device and hence the security level of the device is increased since suitable technology for forming a pattern integrally with a transparent layer is not widely available to would-be counterfeiters.

Security devices utilising a pattern of raised elements in combination with a coated pattern are also known, for example, from US-A-2007/0246932, CA-A-2667081, CA-A-2490834 and CA-A-2642330. Here, embossed structures are formed in the surface of a data carrier substrate such as a bank note paper with a printed pattern carried on the resulting surface relief. The resulting latent effects are visible when the device is viewed under reflected light at different tilt angles. However, the present inventors have found that by forming regions of raised surface relief in an at least semi-transparent layer, more complex visual effects can be generated and hence the security level of the device is increased. The optically variable effect is generally due to portions of the second pattern being more visible at some angles of view than others (as a result of the contours of the first pattern), whereby the appearance of the device changes upon tilt. As discussed below, the raised regions themselves may or may not be semi-transparent and indeed particularly distinctive effects can be generated where the raised regions are also of an increased optical density as compared with intervening regions of the layer.

The colour layer may also be formed in a number of different ways, including printing and coating but also metallisation. By "colour" any optically detectable substance is envisaged, including inks or other coatings comprising pigments, or metal layers which could be purely reflective and may not themselves contribute to the perceived colour (e.g. "silver"-type layers where the apparent colour will be due to the surroundings rather than the material forming the layer itself). "Colours" such as white, grey and black are equally to be included, alongside primary colours such as red, green and blue and all other colours in between. The colour layer may be substantially opaque, translucent or semitransparent.

The manner in which the first and second patterns must be configured to attain an optically variable effect depends upon the specifics of the other pattern, as will be apparent from the examples given below. In some examples, the first pattern will act as a selecting layer, causing selected portions of the second pattern to become visible to a greater or lesser extent depending on the angle of view. This may be due to a masking effect where the regions of the first pattern are of increased optical density, or to a shadowing effect where the regions of the first pattern have a surface relief, or to a combination of both effects. The second pattern can therefore be designed such that its portions that will be selected at any one viewing angle combine to give a desired appearance.

Preferably, the pitches of the first and second patterns along at least one axis of each pattern are similar or approximately equal, preferably lying within about 25% of each other, more preferably about 10%. If the two patterns have pitches which are significantly different to one another, it is generally difficult to attain a distinctive and easily describable overall optically variable effect since the device appearance will not change consistently across its full area when tilted. Nonetheless, certain optical effects depend on there being some mismatch between the pattern pitches and so in certain preferred examples, the pitches of the first and second patterns along at least one axis of each pattern are offset from one another, giving rise to moiré interference between the patterns.

In further preferred embodiments, the axes of the first and second patterns are approximately aligned with one another. However, in other cases, the axes of the first and second patterns are offset by a non-zero angle of less than 45 degree, preferably less than 25 degrees, more preferably less than 15 degrees, most preferably less than 10 degrees, giving rise to moiré interference between the patterns. Such a rotational offset can be utilised instead of or in combination with a pitch mismatch.

In particularly preferred implementations, the first and second patterns comprise screened patterns. A screened pattern is a regularly spaced array of regions/elements, some parameter of which may be altered at selected locations of the array in order that the array as a whole carries an item of information, such as a graphic, text or numeral. For instance, the size of the regions/elements may be increased or decreased across the array, or in certain areas, the pattern of regions/elements may be displaced (e.g. out of phase) relative to that in other areas.

The colour layer could comprise elements of a single colour (which term includes black, grey and white as well as hues such as red, green, blue, cyan, yellow, magenta, plus metallic "colours" such as silver, gold, copper etc) delimited for example by regions defined by the absence of colour (i.e. clear regions). This can give rise for instance to a device having a (single) colour which appears and disappears, possibly via an intermediate "faded" stage, at different view points. However, in preferred embodiments, the second pattern comprises elements of at least two colours. Such implementations can be used to generate effects whereby the appearance of the device appears to change between a first colour and a second colour as the device is tilted.

The security device could exhibit an optical effect which is uniform across its full area, e.g. a colour-changing block. However, in preferred examples, the first or second pattern defines an item of information, preferably text, numerals or a graphic, and the other of the first or second pattern comprises an overlapping regular pattern, whereby the colour(s) of the item of information appear different at different viewing angles. It should be noted that the term "overlapping" as used herein does not specify which layer overlies the other.

In other preferred embodiments, the first or second pattern comprises interleaved sections of at least two items of information, preferably text, numerals or graphics, and the other of the first or second pattern comprises an overlapping regular pattern, whereby at a first viewing angle, a first of the at least two items of information is visible and at a second viewing angle, a second of the at least two items of information is visible, the first and second items of information preferably having different colours. In this way, the information displayed by the device and/or its colour can change as the device is tilted.

As already mentioned, secure visual effects can be achieved using a first pattern which is visible or which possesses a surface relief, or both. In a first preferred implementation, the regions of the first pattern have a high optical density relative to the intervening regions of the at least semi-transparent layer, the first pattern thereby blocking the viewing of portions of the second pattern when the device is viewed in reflection or transmission, different portions of the second pattern being blocked at different angles of view, whereby the appearance of the device changes.

Preferably, the regions of the first pattern are substantially visually opaque. The first pattern can overlie or underlie the second pattern. In the latter case, the optically variable effect will only be revealed when the device is viewed in transmitted light. Advantageously, the device comprises a spacing layer between the first and second patterns, the spacing layer being substantially visually transparent. This increases the amount of the second pattern that can be revealed upon tilting the device, and hence increases the degree of variation in the device appearance that can be achieved.

In another preferred implementation, the first pattern comprises regions of raised surface relief (preferably spaced by non-raised portions of the at-least semi-transparently layer of non-zero width) and the colour layer is arranged to follow the contours of the regions, whereby portions of the second pattern are more visible at some angles of view than others, whereby the appearance of the device changes. For instance, parts of the second pattern that are arranged on a surface of the relief regions that sits at an angle to the plane of the device will become more visible, and hence have a greater influence on the overall appearance of the device, when the device is tilted such that it is viewed approximately perpendicular to the surface in question.

Preferably, the first pattern comprises raised regions each having at least two flank surfaces which are non-parallel to the plane of the device, and the second pattern is configured such that at least two flank surfaces of each raised region exhibit different colour appearances. The flank surfaces may or may not be planar; for instance, they could be convex or concave curves.

In a preferred embodiment, the elements forming the second pattern are of a lateral width which is less than that of each of the raised regions of the first pattern. In this way, each colour element will cover less than a whole one of the raised regions such that different colour effects will be achieved when the region is viewed from different positions. In particularly preferred implementations, the elements forming the second pattern are of a lateral width which is approximately the same lateral width as that of one of the flank surfaces of the raised regions of the first pattern. This maximises the different colour effects visible upon tilting.

Advantageously, the raised regions forming the second pattern are spaced by intervening, non-raised regions which are substantially transparent, and which are concealed by the raised regions to a greater or lesser extent depending on the angle of view. This leads to a particularly complex optical appearance since additional effects can be obtained when the device is viewed in transmitted light.

In particularly preferred implementations, the raised regions forming the second pattern have a peak height which is at least half of the width of each region and/or of the width of the intervening non-raised regions, more preferably approximately equal to the width of each region and/or the width of the intervening non-raised regions. Such high aspect ratios enable the change in optical appearance to be perceived at relatively low tilt angles as compared with known devices. If the raised regions and intervening, non-raised regions of the first pattern are of different widths, it is the ratio of the height to the raised region width which most preferably meets the above criteria. In preferred cases the raised regions and intervening, non-raised regions of the first pattern will be of substantially the same width, or the intervening regions may be of approximately the same lateral width as that of one of the flank surfaces of the raised regions of the first pattern.

Advantageously, the second pattern is configured such that the intervening (non-raised) regions of the first pattern exhibit a colour appearance which is different from that or those of the raised regions. This appearance may be an additional colour or could be clear (i.e. colourless).

In certain preferred implementations, the raised regions of the first pattern each have N (i.e. any positive integer number of) flank surfaces and the second pattern includes elements of N different colours whereby each flank surface of a raised region exhibits a different colour appearance. For example, a line element raised region may have two opposing flank surfaces whereas a square-based pyramid raised region will have four flank surfaces. A raised region with curved relief (e.g. a hemisphere) has in theory an infinite number of flank surfaces but will typically be divided into e.g. 2 or 3 or 4 sectors each acting as one flank surface and carrying one colour. Preferably, the second pattern includes elements of (N+1) colours, whereby the flank surfaces of a raised region and the intervening regions each exhibit a different colour appearance.

Both the colour layer and the raised regions can be opaque, translucent or semi-transparent, and different combinations can be selected to give rise to particular effects. In one preferred embodiment, the raised regions of the first pattern and the elements of the colour layer are at least semi-transparent, whereby at some viewing angles different elements of the second pattern are perceived to overlap such that a combined colour is exhibited. This can be used to create additional colours over and above those of the elements actually provided.

In another preferred implementation, the raised regions of the first pattern are at least semi-transparent and the elements of the colour layer carried on the flank surfaces of the regions are substantially opaque. This enables the optically variable effect to be viewed from both sides of the device.

In a particularly preferred embodiment, the raised regions of the first pattern are of high optical density relative to the intervening regions, preferably substantially visually opaque. This can be used to produce additional, different colour effects when the device is viewed in transmitted light as compared with the appearance of the device in reflection. Advantageously, at least elements of the second pattern corresponding to the intervening regions of the first pattern are semi-transparent. For example, these elements may carry a coloured tint which dominates the appearance of the device when viewed in transmission.

Hence, preferably the device exhibits different colour appearances when viewed on-axis in transmission and in reflection.

The raised regions of the first pattern could take any desirable shape. In particularly preferred embodiments, the raised regions comprise line regions of square, rectangular, triangular, semi-circular or semi-elliptical cross-section, or point regions of pyramidal, hemi-spherical, conical, frusto-conical or polygonal shape (or any mixture thereof). Advantageously, the elements of the second pattern are shaped to approximately correspond to the shape of the flank surfaces of the raised regions, preferably taking the form of lines, squares, rectangles, triangles, circles, circle segments and the like. However, this is not essential since the colour elements need not cover the entirety of any flank surface.

In one particularly preferred embodiment, the first and second patterns comprise linear regions and linear elements, respectively, wherein the width of the linear regions of the first pattern is approximately twice the width of the linear elements of the second pattern. This has been found to produce particularly effective results. Advantageously, the linear regions of the first pattern are spaced by intervening, non-raised lines of approximately half the width of each linear region. In this way, the intervening, non-raised lines correspond approximately to the width of the colour element lines. Preferably, the second pattern comprises linear elements in two or three colours, wherein for each linear raised region, each flank has a different colour appearance and the adjacent intervening region, if provided, has a third, different colour appearance. This gives rise to a particularly effective variation in appearance at different viewing angles.

The different layers of the security device can be formed in various ways. In one preferred example, the at least semi-transparent layer is a polymer layer carrying a surface relief in the form of the first pattern, the surface relief preferably comprising a cast-cured relief. In another particularly advantageous example, the at least semi-transparent layer is an exposed photosensitive film, the regions of the first pattern corresponding to exposed regions of the photosensitive film and having an increased optical density relative to unexposed regions, wherein the photosensitive film is adapted to exhibit an increase in optical density upon exposure to radiation of a predetermined wavelength and concurrent or subsequent heating, the increase in optical density being due to the formation of bubbles within the photosensitive film. Photosensitive films of this sort are generally referred to as "vesicular" films and are described in more detail in our co-pending International patent application no. PCT/GB2012/052520. Preferably, the exposed regions of the vesicular film exhibit a surface relief.

As already mentioned, the colour layer could be formed using any technique resulting in an optically detectable substance but in particularly preferred implementations the colour layer comprises a print, a coating, a laminate or a metallisation (or any combination thereof).

The first aspect of the invention further provides a method of making a security device, comprising:
(a) providing an at least semi-transparent layer;
(b) modifying regions of the at least semi-transparent layer to form a first pattern of integral regions having a higher optical density relative to intervening regions of the layer; and, before, during or after step (b):
(c) applying a colour layer on one side of the at least semi-transparent layer, the colour layer forming a second pattern of elements of at least one colour;
wherein the first and second patterns at least partially overlap one another and are configured such that, when the device is viewed from at least one side, the first and second patterns co-operate to generate an optically variable effect, whereby the appearance of the device varies at different viewing angles.

The second aspect of the invention also provides a method of making a security device, comprising:
(a) providing an at least semi-transparent layer;
(b) modifying regions of the at least semi-transparent layer to form a first pattern of integral regions having a raised surface relief relative to intervening regions of the layer; and, before, during or after step (b):
(c) applying a colour layer on one side of the at least semi-transparent layer, the colour layer forming a second pattern of elements of at least one colour following the contours of the raised surface relief;
wherein the first and second patterns at least partially overlap one another and are configured such that, when the device is viewed from at least one side, the first and second patterns co-operate to generate an optically variable effect, whereby the appearance of the device varies at different viewing angles.

The methods result in security devices of increased security level and, preferably, enhanced optical effect, for the same reasons as discussed above.

Depending on the optical effect to be achieved, the first pattern will be implemented in different ways. In a preferred embodiment, the regions forming the first pattern have a higher optical density than the intervening regions and the method further comprises providing a substantially transparent spacing layer between the first and second patterns.

In other preferred implementations, the regions forming the first pattern have a raised surface relief relative to the intervening regions, and the colour layer follows the contours of the raised surface relief. In this case, the raised regions may also have a higher optical density than the intervening regions, giving rise to particularly complex optical effects.

The techniques for forming the first pattern will also vary accordingly. In one preferred example, the at least semi-transparent layer is a polymer layer, and step (b) comprises cast-curing a surface relief into the polymer layer to thereby form the first pattern.

In another preferred example, the at least semi-transparent layer is a photosensitive film adapted to exhibit an increase in optical density upon exposure to radiation of a predetermined wavelength and concurrent or subsequent heating, the increase in optical density being due to the formation of bubbles within the photosensitive film, and step (b) comprises:
 (b1) exposing the photosensitive film to radiation of a predetermined wavelength to which the photosensitive film is responsive through a mask defining the first pattern; and
 (b2) heating the exposed photosensitive film,
whereby the optical density of the exposed regions of the photosensitive film is increased such that a reproduction of the first pattern is displayed by the photosensitive film, step (b2) optionally resulting in a raised surface profile of the exposed regions.

The heating step could be carried simultaneously with the exposing through the mask, or subsequently. If subsequent, it is advantageous that there is not too long a delay between the exposing and the heating, to avoid the released gas molecules leaching out of the material before forming bubbles. This could reduce the degree of bubble formation and hence the contrast achieved in the pattern. Therefore, preferably, the heating step takes place no more than 2 hours after the step of exposing the photosensitive film through the mask, more preferably no more than 1 hour, yet more preferably no more than 10 minutes, still preferably no more than 1 minute, most preferably substantially immediately after the step of exposing the photosensitive film through the mask.

Preferably, step (c) takes place before step (b1) or between steps (b1) and (b2). That is, the colour layer is preferably applied before heating takes place. This is particularly advantageous where the heating results in a raised surface profile since the colour layer can be applied whilst the photosensitive film is flat and will then adopt the desired relief profile when the film is heated. Applying the colour layer to a flat surface ensures it can be laid down accurately and making use of conventional, well established techniques. Preferably, step (c) comprises printing, coating, laminating or metallising the colour layer on to the device. As discussed above, the colour layer can include any optically detectable substance and may not itself contribute to the actual "colour(s)" perceived, e.g. if it is purely reflective.

Additional processing steps can be carried out after formation of the pattern in the photosensitive film to deactivate the film and prevent any further patterning. In particularly preferred examples, this is achieved by, after step (b2):
 (b3) exposing the photosensitive film to radiation of the predetermined wavelength; and then
 (b4) maintaining the exposed photosensitive film at temperatures sufficiently low to so as not to give rise to the formation of bubbles for a sufficient duration after which elevation to higher temperatures does not cause the formation of bubbles.

In step (b3), previously unexposed regions of the film are exposed to release gas in the manner described above. However, instead of heating the film, the film is then kept at temperatures which do not promote gas migration, e.g. left at ambient room temperature, for a period of time which is sufficiently long that the released gas leaches out of the film without forming significant bubbles. Following this, subsequent exposure and/or heating will have no or negligible effect on the film, thereby effectively fixing the predetermined pattern and preventing alteration.

Preferably, in step (b3), substantially the whole of the photosensitive film is exposed to radiation of the predetermined wavelength. However, in theory only those portions of the film which were not exposed during the patterning need be exposed during step (b3). Moreover, any portions of the film which will not ultimately form part of the security device or will not be visible in the final arrangement of the device need be exposed.

The conditions under which the film should be maintained in step (b4) will depend on the particular chemistry of the photosensitive film as well as its dimensions (particularly its thickness). Appropriate conditions can be determined empirically by carrying out step (b4) at different temperatures and durations and then heating at least to temperatures similar to those used during patterning, and the film examined to determine whether any further bubbles have been formed. In preferred examples, step (b4) comprises maintaining the exposed photosensitive film at temperatures below 70 degrees C., preferably below 50 degrees C., more preferably below 25 degrees C. for at least 2 hours, preferably at least 4 hours, more preferably at least 8 hours. For example, the twice exposed film may be stored overnight at room temperature. It should be noted that the maintaining step does not require active control of the temperature conditions, although in hot environments this may be desirable.

The method can be adapted for the manufacture of any of the features of the security device already described above.

In accordance with another aspect of the invention, a security device is provided comprising:
 a first photosensitive film exhibiting a pattern of regions of relatively high and relatively low optical density, respectively, the pattern arising from exposure of the photosensitive film to radiation of a predetermined wavelength to which the photosensitive film is responsive; and
 a colour layer overlapping the pattern exhibited by the first photosensitive film,
where in the photosensitive film is adapted to exhibit an increase in optical density upon exposure to radiation of a predetermined wavelength and concurrent or subsequent heating, the increase in optical density being due to the formation of bubbles within the photosensitive film.

As described above, photosensitive film of this sort ("vesicular film") can advantageously be used in the formation of security devices with an optically variable effect arising from the interplay between a vesicular film pattern and a colour layer pattern. However, vesicular film patterns can also be used in combination with colour layers to form many other types of security device to great benefit. In particular, the vesicular film pattern may by itself or in combination with another component give rise to a secure visual effect (which may or may not be optically variable), the colour layer further enhancing the overall visual impact of the device by providing additional colour effects, such as a background colour. This further increases the difficulty of forging a counterfeit version of the device, and also permits a greater degree of individualisation of the devices. For instance, a series of devices could be produced with identical copies of the vesicular film pattern but different colour layers (patterned or otherwise). This would be more cost-efficient than altering the vesicular film pattern for different devices.

Hence in some preferred examples, the colour layer provides a colour background against which the pattern of exposed regions is visible when the device is viewed in reflected or transmitted light. Advantageously, the pattern comprises micro-text or micro-images, or a guilloche or fine line pattern—i.e. a secure visual effect.

In other preferred embodiments, the security device further comprises a second vesicular film separated from the first vesicular film by one or more layers which are at least semi-transparent in the visible spectrum, the second vesicular film exhibiting a second pattern of regions of relatively high and relatively low optical density, respectively, the second pattern arising from exposure of the second vesicular film to radiation of a predetermined wavelength to which the second vesicular film is responsive, the first and second patterns at least partially overlapping one another and the colour layer. The combination of two overlapping vesicular film patterns can be used to give rise to a number of optically variable effects, as described in our co-pending International patent application no. PCT/GB2012/052520, with the colour layer providing an additional dimension to such effects.

For instance, in one preferred implementation, the first and second patterns in combination form a coloured venetian blind device, having an appearance which differs at different viewing angles. In another preferred implementation, the first and second patterns in combination form a coloured moiré interference device, having an appearance which differs at different viewing angles.

In yet another advantageous embodiment, the device further comprises one or more focussing elements (e.g. lenses or mirrors) defining a focal plane, the pattern exhibited by the vesicular layer being substantially coincident with the focal plane, whereby a coloured, focussed version of at least a portion of the pattern is generated. In certain embodiments, the focussing element(s) and pattern form in combination a coloured lenticular device, the pattern preferably comprising elements of a first image and elements of a second image arranged such that when the lenticular device is viewed from a first angle, a focussed version of the first image is generated, and when the lenticular device is viewed from a second angle, a focussed version of the second image is generated.

In certain other preferred embodiments, the device further comprises a regular array of micro-focussing elements, the pattern exhibited by the vesicular layer being substantially coincident with the focal plane, and the pattern exhibited by the vesicular film comprising a corresponding array of microimage elements, wherein the pitches of the micro-focusing elements and the array of microimage elements and their relative locations are such that the array of micro-focusing elements cooperates with the array of microimage elements to generate a magnified version of the microimage elements due to the moiré effect, the array of focussing elements and predetermined pattern forming in combination a coloured moiré magnification device.

The exposed regions of the photosensitive film may be flush with the remainder of the film. However, in particularly preferred embodiments, the regions of relatively high optical density have a surface relief relative to the regions of relatively low optical density. This can be used in a number of ways as described above, and in a further implementation, the pattern displayed by the vesicular film comprises a plurality of spaced exposed regions of relatively high optical density, each exposed region having a raised surface relief, configured such that the appearance of the predetermined pattern varies depending on the viewing angle due to the raised regions concealing the intervening spaces to a greater or lesser extent, the colour layer underlying the vesicular film, whereby the predetermined pattern forms a coloured latent device. Preferably, the distance by which the regions are spaced is less than twice than the maximum height of the regions, more advantageously substantially equal to the maximum height of the regions. Such high aspect ratios enable optically variable effects to be viewed at relatively low tilt angles.

In other examples, as already described above, the pattern displayed by the vesicular film comprises a plurality of spaced exposed regions of relatively high optical density, each exposed region having a raised surface relief, and the colour layer follows the contours of the surface relief, whereby portions of the colour layer are visible to a greater or lesser extent depending on the angle of view.

In this aspect of the present invention, the colour layer could be of a single, continuous, all-over colour. However, to increase the complexity of the device, the colour layer advantageously comprises a pattern of elements of at least one colour, preferably at least two colours. In this case, the vesicular film pattern and the colour layer pattern preferably at least partially overlap one another and are configured such that, when the device is viewed from at least one side, the appearance of the device varies at different viewing angles, as described above.

The colour layer could take any of the forms already described above and in particularly preferred examples, the colour layer is semi-transparent.

The invention further provides a security article comprising a security device as described above. Preferably, the security article is a thread, strip, foil, patch or label. The articles could be formed as transfer elements on a carrier layer which may or may not be removed once the article is attached to an object, e.g. by hot stamping.

Also provided is an object of value comprising a security device or a security article each as described above, the object of value preferably being a document of value such as a banknote, a cheque, a passport, a visa, a tax disc, an ID card, a certificate, a stamp, a ticket, a share certificate, a drivers' licence, or a certificate of guarantee.

Examples of security devices and methods of manufacture thereof will now be described with reference to the accompanying drawings, in which:

FIG. 1 depicts a first embodiment of a security device, in (a) cross-section and (b) plan view;

FIG. 2 depicts a second embodiment of a security device, in (a) cross-section and (b) plan view;

FIG. 3 depicts a third embodiment of a security device, in cut-away perspective view;

FIG. 4(a) depicts a fourth embodiment of a security device, in cross-section,

Figure 5:
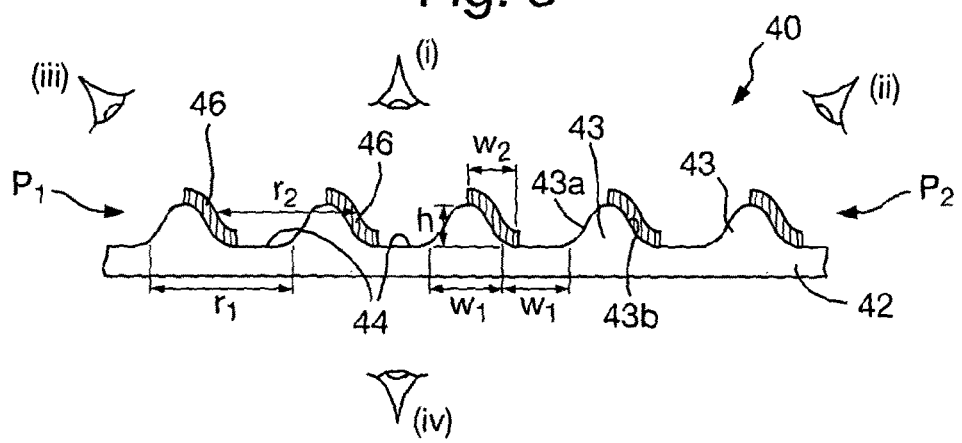
Figure 6:
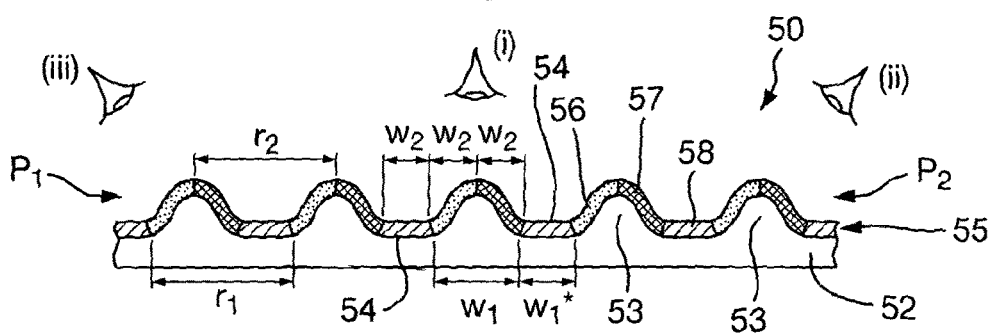
Figure 7:
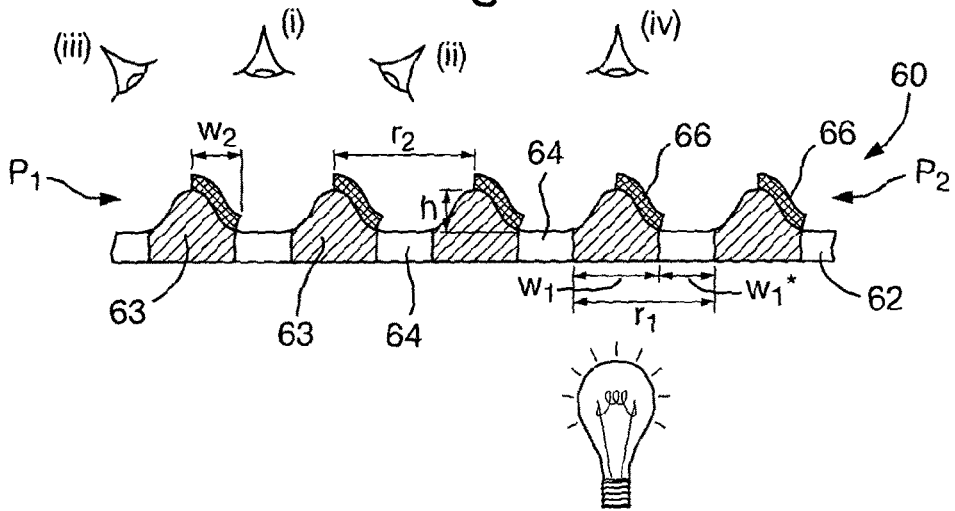
Figure 8:
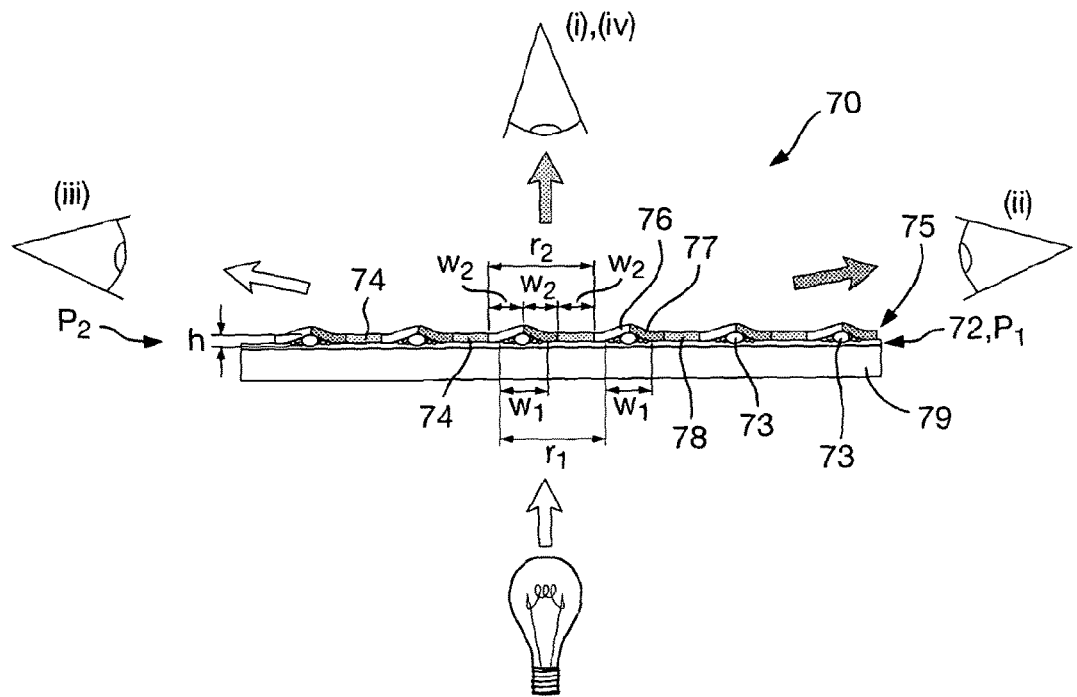
Figure 10:
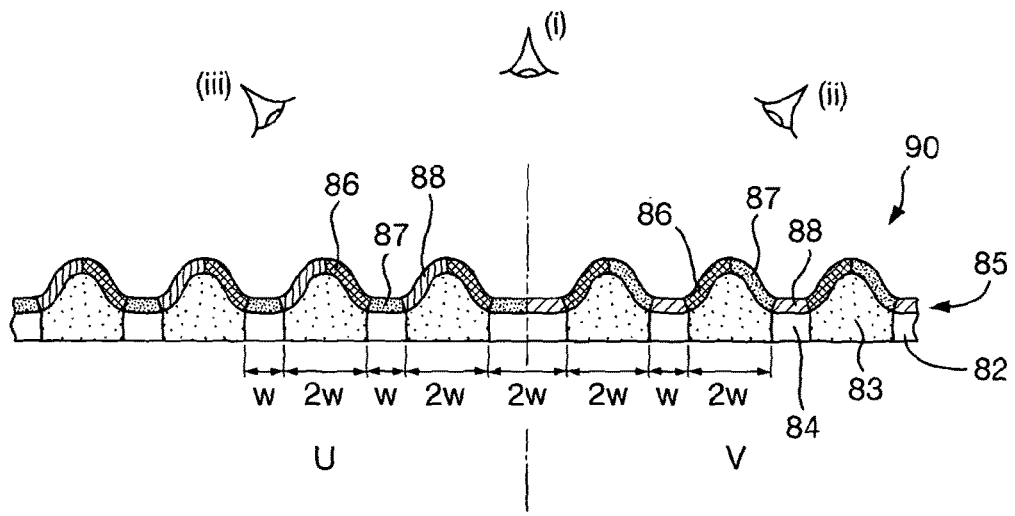
Figure 12A:
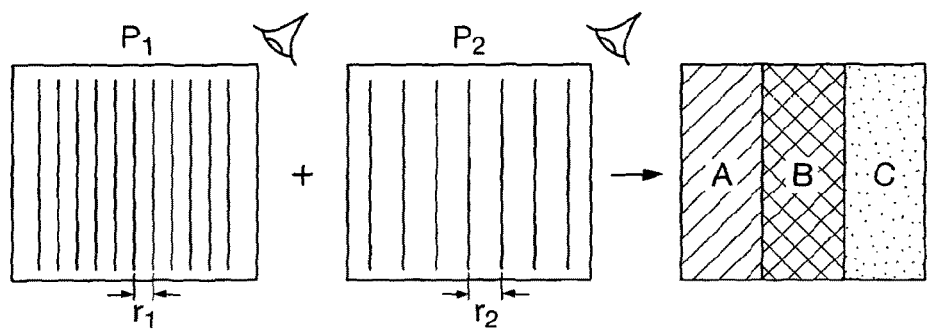
Figure 12B:
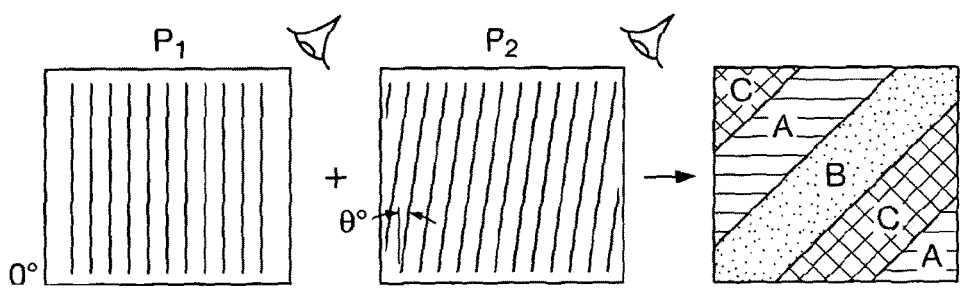
Figure 11A:
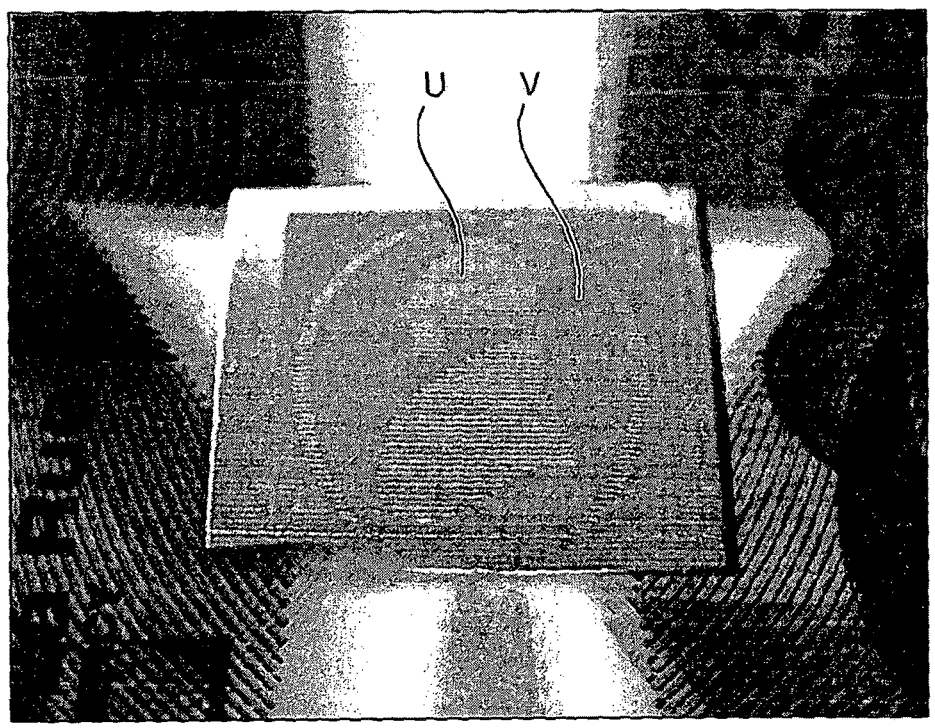
Figure 11B:
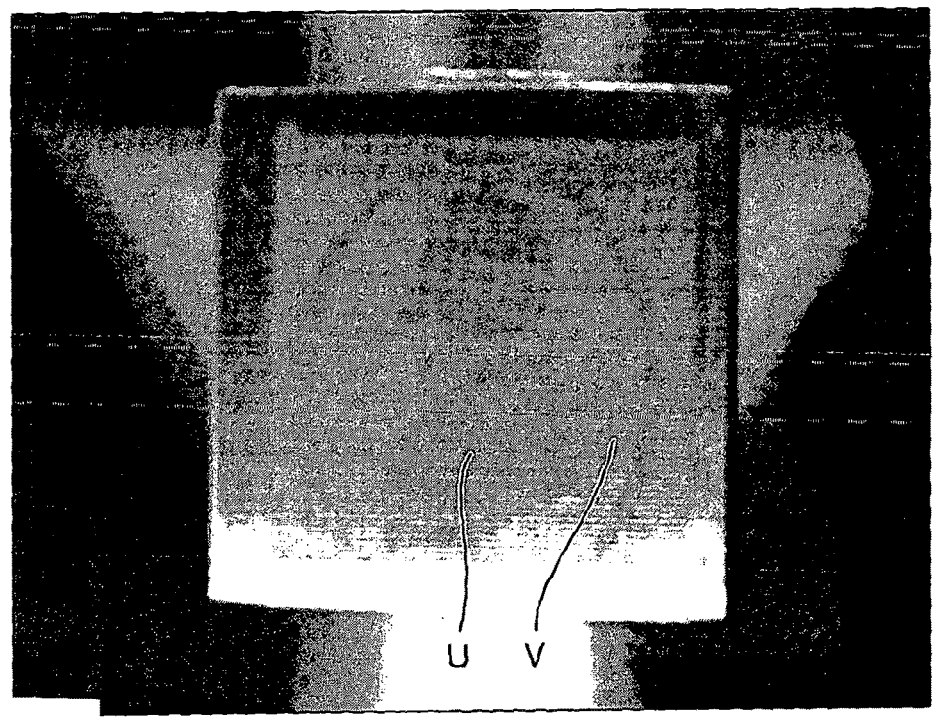
Figure 13:
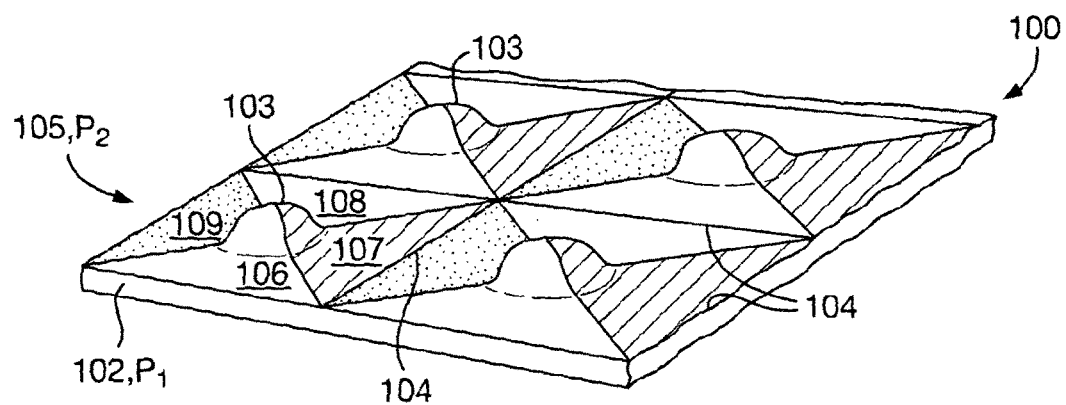
Figure 14A:
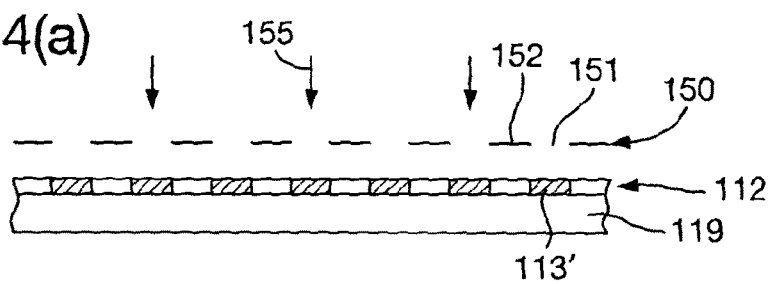
Figure 15A:
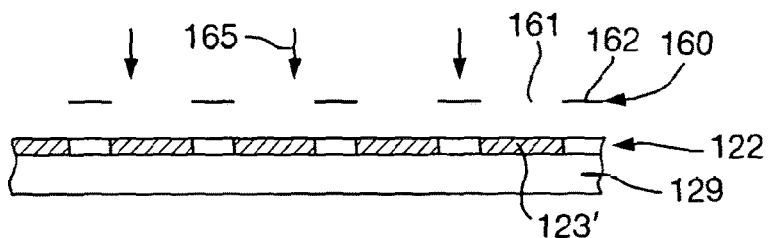
Figure 16A:
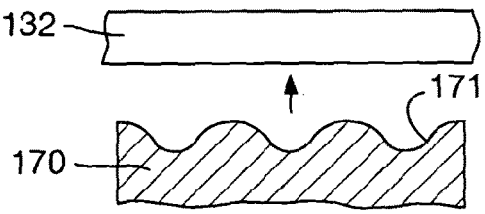
Figure 17A:
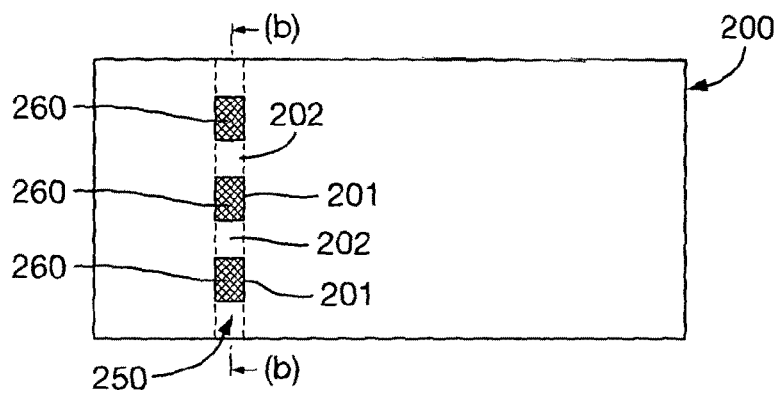
Figure 17B:
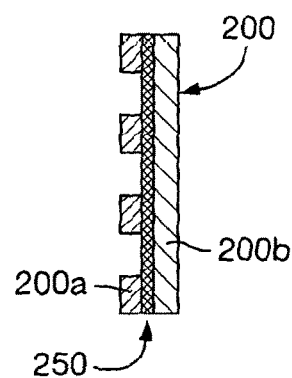
Figure 18A:
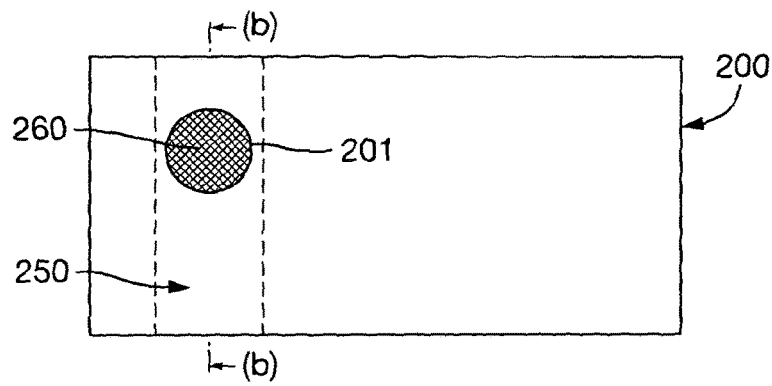
Figure 18B:
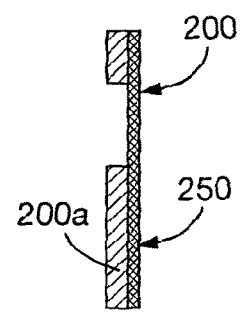
Figure 19A:
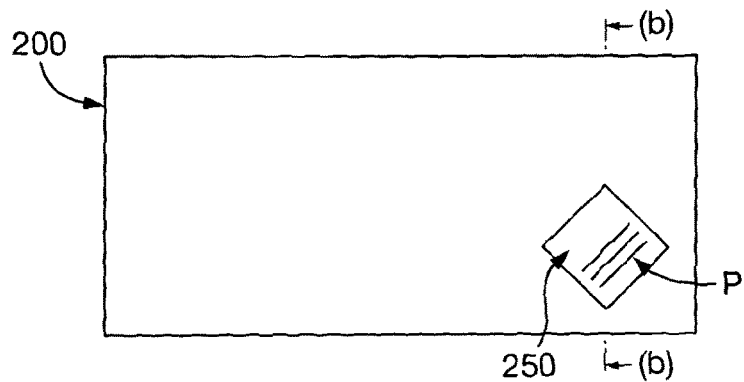
Figure 19B:
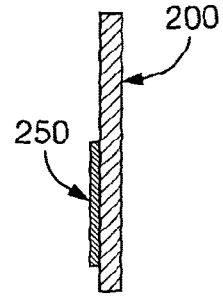

FIG. 4(b) illustrating exemplary images displayed by the device;

FIG. 5 depicts a fifth embodiment of a security device, in cross-section;

FIG. 6 depicts a sixth embodiment of a security device, in cross-section;

FIG. 7 depicts a seventh embodiment of a security device, in cross-section;

FIG. 8 depicts an eighth embodiment of a security device, in cross-section;

FIG. 9 depicts a ninth embodiment of a security device, in (a) plan view, and (b) partial cross-section;

FIG. 10 depicts a tenth embodiment of a security device, in cross-section;

FIGS. 11(a) and 11(b) show an eleventh embodiment of a security device at two different angles of view;

FIGS. 12(a) and 12(b) schematically illustrate the formation of moiré variable colour effects from first and second patterns with a mismatch;

FIG. 13 depicts a twelfth embodiment of a security device, in perspective view;

FIGS. 14(a), (b) and (c) show steps of an exemplary method for manufacturing a security device;

FIGS. 15(a), (b) and (c) show steps of another exemplary method for manufacturing a security device;

FIGS. 16(a), (b) and (c) show steps of a further exemplary method for manufacturing a security device; and FIGS. 17, 18 and 19 depict exemplary objects of value comprising security devices, in (a) plan view and (b) cross section.

FIGS. 20(a)-20(e) show steps of a further exemplary method of manufacturing a security device.

Figure 21:
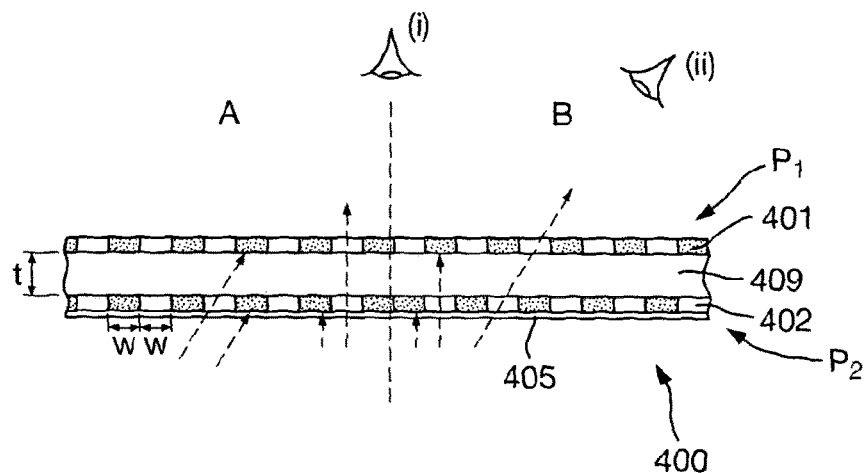
Figure 22:
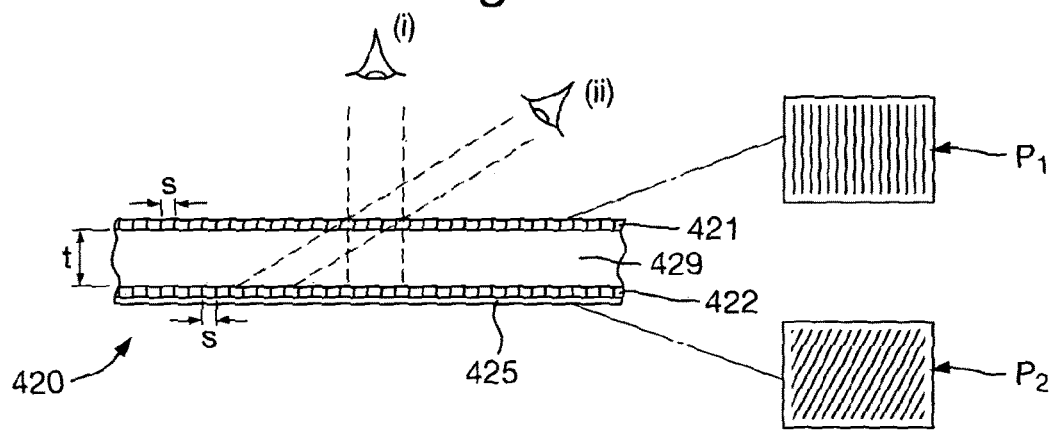
Figure 23:
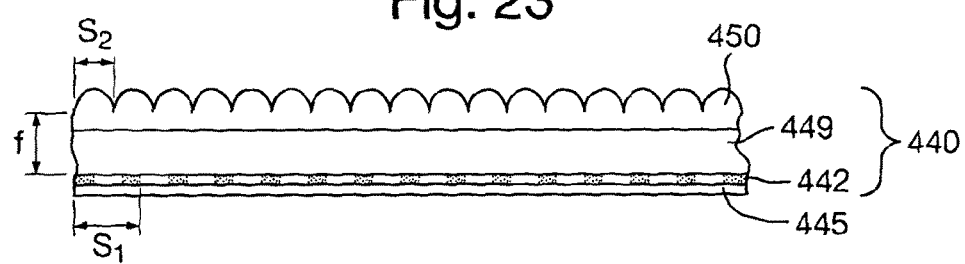

FIGS. 21, 22, and 23 show three further examples of security devices.

The present inventors have found that the combination of a colour layer with a pattern of visible and/or raised regions formed in a layer which is otherwise substantially visually transparent (or at least semi-transparent) can be used to form security devices with an increased level of security. On one level, the formation of a pattern integrally with a transparent layer (as opposed to applying a pattern to such a layer) itself provides a testable security feature not easily reproduced by would-be counterfeiters. However, in combination with a colour layer, particularly distinctive visual effects can further be achieved and examples of these will now be described.

Generally, the transparent layer will be a polymeric layer and, in the majority of the following embodiments, the devices comprise a vesicular film exhibiting the aforementioned integral pattern. This is not essential but is preferred for most embodiments since, as described in our co-pending International patent application no. PCT/GB2010/052520, it is possible to achieve very high resolution patterns through the exposure and subsequent heating of vesicular film. Vesicular film is a type of photosensitive polymeric material which reacts to radiation of a particular corresponding wavelength causing the release of gas atoms or molecules within the film structure. Upon subsequent (or simultaneous) heating, the released gas migrates within the film, collecting to form bubbles (vesicles) which scatter light and hence locally increase the film's optical density, unexposed regions remaining semi-transparent. Thus when exposed to appropriate radiation through a patterned mask, a negative version of the pattern is transferred to the vesicular film. Suitable techniques and apparatus for forming a pattern for a security device in a vesicular film are disclosed in our above-mentioned patent application, which is hereby incorporated by reference in its entirety. As explained therein, if the dosages of radiation and heat are sufficiently high, the exposed regions will not only exhibit an increased optical density but will also develop a surface relief, which is used in selected embodiments described below.

An example of a suitable vesicular film which can be used in any of the embodiments described below is the "vesicular microfilm" product by Exopack Advanced Coatings of Matthews, N.C., USA. This is a diazo-containing vesicular film which is responsive to radiation in the UV spectrum. For instance, a 5 µm layer of this vesicular film may be carried by a support layer such as PET or BOPP and exposed to UV radiation at a power of around 120 W for fractions of a second (e.g. a duration between 0.01 s to 1 s), followed by heating at between 70 and 150° C. for between 1 and 60 seconds, depending on the degree of optical density and surface relief desired. Further details of suitable processing parameters can be found in our International patent application no. PCT/GB2012/052520.

A first embodiment of a security device 1 will now be described with reference to FIG. 1. This is a coloured microtext device and comprises a patterned vesicular film 2 overlying a colour layer 5, separated by an optional transparent support layer 9. The vesicular film 2 carries a pattern $P_1$ of exposed regions 3 which are of relatively high optical density (preferably substantially opaque) compared with the intervening, unexposed regions 4, which are preferably substantially visually transparent although may possess a coloured tint (integral to the vesicular film 2). The pattern $P_1$ defines information items which here constitute microtext in the form of letters "AB", as shown in the plan view of FIG. 1(b). Of course, any other information items such as numbers, symbols, graphics, fine line patterns or guilloches could be formed instead. The pattern $P_1$ is formed with such dimensions that the information "AB" is revealed only under magnification and is generally not apparent to the unaided human eye and unresolvable via conventional reproduction processes such as photocopying. For example, the characters "AB" may have a line width of around 5 µm and a lateral height of around 20 to 30 µm. The use of vesicular film is particularly well suited for the formation of patterns of such high resolution, as described in our International patent application no. PCT/GB2012/052520.

When viewed from above (on the side of vesicular film 2), the colour layer 5 is visible through the unexposed regions 4 of pattern $P_1$, the remainder of the colour layer 5 being masked by the exposed regions 3. The microtext therefore appears to have the colour of colour layer 5, which in this example is constant over the full area of layer 5, such that the appearance of the device will be the same at all angles. However, in other examples, the colour layer 5 could carry a pattern of coloured elements such as stripes. Depending on the configuration of the stripes, each microtext character "A" and "B" could have a different, constant colour or contain multiple colours within a single character.

The colour layer 5 is preferably formed by printing onto the spacing layer 9, which is typically formed of PET or BOPP for example. Any convenient printing technique such as gravure, lithographic, screen printing, inkjet or dye diffusion thermal transfer printing could be employed to form colour layer 5. In practice, lithographic printing may be preferred if high definition is desired since resolutions of as low as 15 microns can be achieved. In other implementations, gravure printing may be preferred, such as where metallic inks are to be laid down. However, in place of a printed layer, the colour layer 5 could take the form of a coating, which is for example extruded onto the spacing layer 9 or co-extruded with spacing layer 9, or a metallisation. In this connection it should be noted that the term "colour" is intended to encompass all shades imparted to a material such that it is not clear, including black, grey, white, silver, gold, bronze as well as "conventional" colours such as red, green, blue, cyan, magenta, yellow etc.

The coloured layer could take the form of a vapour deposited metallic coating (such as vapour deposited aluminium, copper or any other suitable metal or alloy thereof). Alternatively the coating could also be formed using metal or metallic-like inks, vapour deposited thin film interference structures, optically variable liquid crystal films or pigmented inks or coatings, optically variable photonic crystal films or pigmented inks or coatings, or coatings formed from interference pigments and/or pearlescent pigments.

A vapour deposited layer may be patterned by using a mask during the vapour deposition process, or in the case of metallic layers by fully metallising and then demetallising. The demetallisation process is achieved using a known method, such as the direct etch technique or the resist and etch technique such as is described in U.S. Pat. No. 4,652,015.

The colour layer 5 can be opaque or semi-transparent, and in the latter case, the secure effect will be also visible in transmitted light from either side of the device.

FIG. 2 depicts a second embodiment of a security device 10 which has an optically variable effect. The device 10 comprises a vesicular film 12 overlying a patterned colour layer 15, spaced by a transparent layer 19. Vesicular film 12 carries a first pattern $P_1$ of spaced regions 13 which are of relatively high optical density compared with the intervening regions 14. The regions 13, 14 could define for example, line elements which may be straight or curved. The colour layer 15 likewise comprises a pattern $P_2$ of colour elements 16 spaced by intervening regions 17 which in this case have no colour (i.e. are clear, for instance due to the absence of print). The colour layer 15 can be formed in the same way as in the first embodiment. In this example, the pattern $P_2$ is also a line pattern and, in the portion of the device depicted in FIG. 2(a), the colour elements 16 are generally aligned underneath each exposed region 13 of the vesicular film pattern $P_1$. As such, when this portion of the device is viewed from an on-axis position illustrated by observer (i), the device will appear to have no colour, having an overall optical density which is the average of the dark and light regions 13, 14 of the vesicular film pattern (assuming the widths of those regions are substantially the same). However, when the device is tilted so that viewing takes place at an angle (observer (ii)), the coloured elements 16 become visible through the unexposed regions 14 of pattern $P_1$ such that the device takes on a new overall colour formed by the combination of the colour of elements 16 and the exposed regions 13.

The repeat distance (i.e. the pitch) of the first pattern, $r_1$, is preferably approximately the same as that of the second pattern, $r_2$. The angle to which the device must be tilted before the above-described change in colour will be perceived depends upon the width w of the exposed regions 13 and colour elements 16 (which should be approximately equal), and that of the intervening regions 14, 17, which is preferably also the same, as well as the spacing between the two patterns which is determined by the thickness t of the spacing layer 19. The higher the ratio of t to w, the smaller the tilt angle required in order to perceive the change in colour. Preferably the ratio t:w is at least 1:1. The use of vesicular films to form the pattern $P_1$ is therefore particularly advantageous since very high resolutions can be achieved (and hence low line width, w), which enables the device to be formed with a high aspect ratio, whereby the change in colour can be perceived at relatively low tilt angles. Alternatively, the thickness t of the spacing layer 19 can be reduced. Suitably high resolution in the colour layer can be achieved for example using a wet lithographic print. For instance, this technique can be used to form patterns with line widths (w) as low as around 15 microns. In combination with a substrate thickness (t) of around 30 microns, the ratio t:w is sufficiently high to achieve a strong optically variable effect at relatively low angles.

The whole security element could be formed by a colour-changing area having the above-described structure. However, an enhanced optical effect can be provided by incorporating an item of information into the device. FIG. 2(b) shows the device 10 in plan view and it will be seen that the device has two areas, X and Y, adjacent one another. In area X, the device has the above described structure and will appear colourless when viewed on-axis, attaining a colour when viewed at a sufficient angle. In area Y, the patterns $P_1$ and $P_2$ are configured to be out of phase with one another, in which case the area will have a coloured appearance when viewed on-axis and colourless at an angle. As the whole device is tilted away from the normal, the colour will therefore appear to switch from area Y to area X. Such an arrangement can be provided, for example, by adjusting the placement of pattern elements in a defined area of one of the patterns $P_1$ and $P_2$ whilst the other pattern is regular across the full extent of the device. Whilst here the two areas X, Y are simply depicted as squares, in practice any item of information such as text, numbers or a graphic can be defined in the same way.

It should be noted that, although desirable, it is not essential for the patterns $P_1$ and $P_2$ to be registered to one another. Even if there is an offset between the two patterns, provided the offset is different in areas X and Y, a colour switch will still be visible.

Again, if the colour layer 15 is semi-transparent, the effect will be visible in transmitted as well as reflected light.

In a variation of this embodiment, the colour layer 15 could comprise elements of more than one colour. For instance, elements 16 could be of a first colour, such as red, and elements 17 of a second colour such as blue. The device would then exhibit a switch from red to blue (or vice versa) upon tilting.

FIG. 3 shows a third embodiment of a security device 20 which exhibits an optically variable effect. Again, a patterned vesicular film 22 and patterned colour layer 25 are provided on either side of a transparent spacer 29 and each of these layers may be formed using the same techniques as described in the previous examples. Here, the pattern $P_1$ carried in the vesicular film takes the form of a series of spaced circular non-exposed regions 24 surrounded by a continuous exposed region 23 of increased optical density. The non-exposed regions 24 are positioned to define an item of information, here the digit "5".

Underlying the patterned vesicular film 22, the colour layer 25 carries a pattern $P_2$ which here is a regular grid of colour elements 26, 27 . . . in repeating blocks of four. As in the previous embodiment, the colour elements 26, 27 are sized to have a similar lateral dimension as that of the transparent regions 24 of the pattern $P_1$ and a similar repeat distance $r_2$ (i.e. pitch) as the spacing $r_1$ of the transparent regions 24. When the device is viewed on-axis from the position of observer (i), a first selected set of the colour elements 26, 27 will be visible through the pattern $P_1$ and preferably these are all of the same colour, e.g. red. When the device is viewed from an off-axis position (observer (ii)), a different set of the colour elements 26, 27 will be revealed and thus the digit "5" will appear to change colour.

FIG. 4 illustrates a fourth embodiment of a security device 30. Again, the device comprises a patterned vesicular film 32 and a patterned colour layer 35 spaced by a transparent layer 39, each formed using the same techniques as before. In this case, both the colour and the information content of the device changes as the device is tilted. The vesicular film 32 carries a pattern $P_1$ which forms a masking grid, e.g. formed of linear exposed regions 33 and intervening transparent lines 34. Underlying the vesicular film, the pattern $P_2$ of colour elements 36, 37 on layer 35 is made up of interlaced portions, e.g. slices, of five images, labelled 1 to 5. FIG. 4(b) depicts five exemplary images that could be used for this purpose, which here illustrate a sun symbol, three intermediate images and a moon-shaped symbol. Slices of the five images are arranged to form pattern $P_2$ such that a first slice of image 1 is adjacent the first slice of image 2, and so on. Each of the images may be formed in a different colour, e.g. image 1 could be yellow and image 5 blue, with images 2, 3 and 4 in various stages of green.

When viewed from an in-line position (observer (i)), the vesicular film pattern $P_1$ masks all of the colour layer 35 except those pattern elements making up image 3. Overall, therefore, the device exhibits a recombined version of image 3, which is green. On tilting, the other images carried within pattern $P_2$ will be revealed. For instance, observer (ii) will perceive image slices making up sun image 1, which is yellow, whereas observer (iii) will view moon image 5, which is blue. As the device is gradually tilted, the sequence of images will therefore appear as an animation, changing both in terms of the graphic presented and its colour.

In order for the full effect to be generated, the width w of each image slice 36, 37 is preferably approximately the same as that of each transparent region 34 through which the colour layer is viewed. The increased optical density regions 33 in this example have a width which is about four times that of an individual image slice, in order that all but one of the five images are masked. However, more generally, where there are N interleaved images, the masking regions 33 will have a width of ((N−1)w), where w is the width of an individual image slice. Overall, the repeat distances (i.e. pitches) $r_1$ and $r_2$ of the two patterns are preferably the same.

The above embodiments each make use of a first pattern $P_1$ which is formed of visible (i.e. increased optical density) regions in an otherwise transparent layer. FIG. 5 shows a fifth embodiment of a security device 40 which exhibits an optically variable effect but in which the first pattern $P_1$ is formed of regions of an at least semi-transparent layer with a raised surface relief rather than an increased optical density. In this example, the raised regions have the same optical density as the remainder of the layer, i.e. substantially visually transparent although in other examples this may not be the case as will be described below.

Security device 40 comprises a transparent layer 42 exhibiting a pattern $P_1$ of raised regions 43 which have a raised surface relief relative to intervening portions 44 of the layer 42. The transparent layer could comprise a polymeric material such as a UV-sensitive resin formulation. As will be described in more detail below, the relief structure can be formed by cast-curing the transparent layer, embossing a lacquer layer or carrying out transparent intaglio printing (i.e. intaglio using a transparent "ink"). Each raised region 43 has at least two flank surfaces 43a, 43b which lie at a non-zero angle to the plane of the device (here, the horizontal). For example, the raised regions 43 may be elongate (line) regions having a substantially triangular, rectangular or (as depicted in FIG. 5) curved cross-section, in which case each region will have two primary flank surfaces extending along the length of the region. In other examples, the raised regions could be "point" or "island" type features, such as cones, pyramids, hemispheres etc, in which case there may be three or more flank surfaces of equal utility.

Overlying relief pattern $P_1$ is a colour layer formed of colour elements 46 making up a second pattern $P_2$. The colour layer follows the contours of relief pattern $P_1$ and can be applied to the relief using any of the afore-mentioned printing, coating or metallisation techniques. The colour elements 46 can be opaque or translucent. In this example, the colour layer comprises a single set of elements 46 of one colour, e.g. line elements, which are spaced by clear intervals, where there is no print for instance. The width $w_2$ of each colour element 46 is no more, and preferably less than, the width $w_1$ of each raised region 43 of the underlying relief such that, no matter how the two patterns are aligned, each colour element 46 will cover less than the whole of each raised region 43. Most preferably, the width $w_2$ of each colour element 46 is approximately equal to the lateral width of each of the flank surfaces 43a, 43b of the raised region. In many cases, the two opposing flank surfaces will meet around the centre of the raised region and therefore, in a preferred case, $w_1 \approx 2w_2$. The repeat distances (pitches) of the two patterns $r_1$ and $r_2$ are preferably approximately the same. In this way, the colour appearance of each of the opposing flank surfaces of any one raised region 43 will differ from one another (provided, in this example, that the two patterns $P_1$ and $P_2$ are sufficiently registered). As illustrated in FIG. 5, here the colour elements 46 each lie on the right flank surface 43b of the respective raised region 43, the left flank surfaces 43a being left uncovered.

If the coloured regions 46 are semi-transparent, when the device is viewed in reflection or transmission from an on-axis position (observer (i)), the device will exhibit an overall colour which is a faded hue of the colour of elements 46, since both the coloured regions and intervening clear regions will be viewed in combination. When the device is tilted in a first direction and observed from the position of observer (ii), the colour intensity will increase since the intervening, non-raised regions 44 of pattern $P_1$, which are largely unprinted, will be concealed from view by the raised regions 43.

When the device is tilted in the opposite direction (observer (iii)), initially the colour intensity will decrease since the colour elements 46 will be viewed substantially along their plane (i.e. parallel to flank surface 43b). However, at higher tilt angles, since the relief regions 43 are at least semi-transparent, the colour intensity will once again increase since the colour elements 46 will be viewed through the relief regions 43. This distinct effect is not achievable in devices based on relief structures in non-transparent substrates. Further, in the present embodiment the same range of visual effects can be perceived from viewing points on the opposite side of the device (observer (iv)). This two-sided visual effect is of particular benefit.

Additional effects can be achieved if the coloured elements 46 are substantially opaque. In this case, when viewed in reflection from on-axis position (i) and tilted positions (ii) and (iii), the device will attain similar overall appearances as before. However, in transmission, at all viewing angles the coloured elements 46 will act as a mask and appear dark, without contributing colour. As such the device will appear substantially clear and invariable in colour. This differing appearance when viewed in reflection and transmission can be easily tested and provides a highly distinctive visual effect. Again, the same effects can be perceived when viewing the device from either side.

The above effects can be enhanced by providing the transparent layer 42 with a coloured tint which is of a different colour to that of colour elements 46. In this case, when viewed in reflection, the device will appear to switch in colour between that of colour elements 46 and that of the layer 42 as the viewing angle is change. In transmission, however, the colour of the layer 42 will dominate at all viewing angles.

The viewing angles at which the colour of the device will appear to change depends on the ratio of the peak height h of the raised regions to the width $w_1$ of the regions and/or the spacing between them (typically the width of the regions themselves and that of the spaces between them will be of a similar order of magnitude, but this is not essential—where they are different, it is the ratio of the peak height to the width of the raised regions that is of primary importance since this determines the angle of the overlying colour elements relative to the plane of the device). The greater the ratio h:w, the smaller the angle through which the device must be tilted before the change will be perceived. In preferred examples, the h:w ratio is at least 0.5:1, more preferably around 1:1. For example, the raised regions may have a height of around 10 μm and a width and spacing (e.g. line width and line spacing) which is approximately the same. Devices with such aspect ratios will exhibit variable effects and relatively low tilt angles and therefore only a slight tilt of the device is needed in order to perceive the effect.

FIG. 6 depicts a sixth embodiment of a security device 50 which comprises a first pattern $P_1$ of relief regions 53 and intervening flat regions 54 formed in a transparent layer 52 as described above. Again, a colour layer 55 is applied which follows the contours of the relief. In this case, the layer 55 is made up of a continuous repeating pattern of colour elements 56, 57, 58 in three colours. As in the previous embodiment, each colour element 56, 57, 58 has a width $w_2$ which is less than the width $w_1$ of each raised region 53, preferably around half the width such that each flank surface has a different colour appearance. The raised regions 53 are spaced by intervening regions 54 which have a width $w_1$* which is approximately equal to the width $w_2$ of the colour elements 56, 57, 58. The repeat distance (pitch) of each pattern $r_1, r_2$, is approximately the same.

The colour layer 55 may be semi-transparent or opaque or may comprise a mixture of semi-transparent and opaque elements 56, 57, 58. In a first example, where all of the colour elements are substantially opaque, the device will generate three distinct colour appearances which can be viewed from either side in reflection. From an on-axis observing position (observer (i)), the device will have an overall colour defined by the combination of all three element types. For example, if the elements 56, 57, 58 are red, blue and yellow respectively, the combination will be have a dark brown/black appearance. When the device is tilted in a first direction (observer (ii)), the device will take on the overall colour of elements 57 (e.g. blue) with the other elements being concealed by the relief pattern. When the device is tilted in a second direction (observer (iii)), the colour of elements 56 (e.g. red) will be dominant.

In another example, where all of the colour elements are translucent, further colour effects can be achieved. For instance, assuming the same arrangement of colours, as the viewing angle is moved towards observer (ii), initially the colour of elements 57 (red) will dominate as before. However, at higher angles, the combination of elements 56 and 57 (blue and red) will become visible through the transparent relief, giving rise to a purple colour. The same will occur at high tilt angles in the opposite direction. Thus the device can exhibit an enhanced range of at least 4 different overall colours.

In a still further example, one or more of the colour elements could be substantially opaque whilst the other elements are translucent. This will preserve at least three distinct colour appearances visible in reflection at different viewing angles (and four if only elements 58, which coincide with the flat regions 54 of relief pattern $P_1$ are opaque). However, the device will now exhibit an additional distinct colour when viewed in transmission. For instance, if both elements 56 and 57 are opaque whilst elements 58 are translucent, when observed in transmission, the device will have the overall colour of elements 58 (yellow), the opaque elements 56 and 57 acting as colourless masks. This configuration is particularly effective since the colour of elements 58 alone is not visible at any viewing angle in reflection. As such the appearance of the device in transmission is quite distinct from that in reflection.

In the above examples, the relief pattern $P_1$ is semi-transparent like the rest of the layer in which it is formed. However, sophisticated visual effects can also be achieved using raised regions of a transparent layer which possess an increased optical density. This is difficult to achieve using conventional techniques. However, the present inventors have found that vesicular films can be patterned in such as way so as to form regions with both high optical density and a raised surface relief. Techniques and suitable processing parameters for achieving such relief patterns in vesicular films are detailed in our International patent application no. PCT/GB2012/052520. For example, a 5 μm thick vesicular film available from Exopack Advanced Coatings of Matthews, N.C., USA can be used. In one example, a vesicular film of this sort exposed via a mask to approximately 100 mJ of UV radiation and then heated at around 125° C. for approximately 45 seconds exhibited high optical density line features of 30 μm width and approximately 18 μm peak height, which are suitable for use in the following embodiments.

The use of a vesicular film to form a relief pattern also provides the very significant advantage that a colour layer which is ultimately to follow the contours of the relief can be applied to the device before the relief itself is formed. This is a substantial benefit since the application of a colour layer, e.g. by printing, to a non-flat surface is inherently difficult and, particularly in "valley" regions of the relief, even coverage may not be achieved. Such problems are eliminated if the colour layer can be applied onto a flat surface. Examples of methods via which this can be achieved are provided below.

FIG. 7 depicts a seventh embodiment of a security device 60 comprising a visible relief pattern $P_1$ formed in a vesicular film 62. The pattern $P_1$ is defined by exposed regions 63, which are both raised and of high optical density (preferably substantially opaque) relative to the intervening unexposed regions 64 which are substantially flat and at least semi-transparent. As mentioned above, the vesicular film 62 may possess a coloured tint. The vesicular film 62 carries thereon a colour layer conforming to the contours of the relief which in this example comprises discrete colour elements 66 forming second pattern $P_2$. The same considerations apply to the lateral dimensions of the first and second patterns as discussed above in relation to FIGS. 5 and 6, and also to the ratio of the height h of the regions 63 to their spacing.

Since the raised regions 63 are themselves substantially opaque, in this embodiment the same effects will be exhibited whether the colour elements 66 are opaque or semi-transparent. When viewed in reflection from the side of the colour layer, a colour change will be perceived as the device is tilted similar to that described above with respect to FIG. 5. From an on-axis position (observer (i)), the device will have an overall colour defined by the combination of coloured elements 66, light raised regions 63 (since they scatter light) and dark intervening regions 64. When tilted in a first direction (observer (ii)), the colour of elements 66 will dominate whereas when tilted in the opposite direction, this colour will be concealed and the device will appear generally light (e.g. white). In contrast, when the device is viewed in transmission (observer (iv)), the regions 63 will act as masks, concealing the colour of elements 66 and as a whole the device will appear colourless due to the transparent regions 64. When viewed from the opposite side, the appearance of the device will be different in reflection since the colour elements 66 will be concealed at most angles of view. However, an optically variable effect at least between light and dark will still be visible as the device is tilted.

FIG. 8 depicts an eighth embodiment of a security device 70 with a similar structure, comprising a vesicular film 72 which here is supported on a transparent layer 79 such as PET or BOPP. As in the previous example, the vesicular film has been exposed to a pattern $P_1$, here a fine line mask, to form raised regions 73 separated by intervening unexposed regions 74. FIG. 8 depicts each raised region as being formed by a collection of bubbles (vesicles), which is the mechanism through which vesicular films are patterned. The relief carries a colour layer 75 which here is a printed repeating pattern $P_2$ of fine line elements 76, 77, 78 in three different colours, e.g. red, blue, yellow respectively. Similar considerations apply to the relative lateral dimensions of patterns $P_1$ and $P_2$ as in the preceding embodiments. In particular, the width $w_2$ of each colour element 76, 77, 78 is preferably less than or equal to the width of each raised region 73, more preferably around half the width such that each colour element 76, 77, 78 approximately covers one flank surface of each raised region 73. In this way, any one raised elements will have opposing flank surfaces of differing colour appearance. Most preferably, the patterns $P_1$ and $P_2$ are registered such that the interface between two adjacent colour elements (e.g. 76 and 77) is located at the peak of the raised region 73, which is typically around its centre point. However as discussed below this is not essential.

As before, the colour layer can be opaque or semi-transparent or comprise a mixture of both types of element. If the colour layer is wholly opaque, the various distinct colour effects that can be perceived at different viewing angles in reflection from the colour layer side of the device (observers (i), (ii), (iii)) will be the same as if the relief were formed on a non-transparent substrate. However, since patterns can be formed in vesicular film to a much higher resolution than is achievable using conventional methods, the effectiveness of the device can be much improved. In particular, the raised regions 73 can be spaced much more closely together than is possible using conventional embossing or blind intaglio techniques, meaning that the ratio of the height h of the regions 73 to their width $w_1$ and that of the spacing between them can be increased, e.g. to at least 0.5:1, which will achieve a good effect or more preferably around 1:1, which although more difficult to achieve is possible with vesicular film and will give particularly good results. A suitably high resolution in the colour layer can be achieved for example through the use of wet lithographic printing. As such, the angle through which the device must be tilted before the change in colour will become visible can be much reduced compared with conventional embossed devices. Of course, unlike conventional devices, the presently disclosed device will also exhibit a colour corresponding to colour elements 78 (yellow) when viewed from the underneath side.

More complex optical effects can be achieved where the colour layer 75 is at least partially, preferably wholly, semi-transparent. In particular it is preferred that the colour elements 78 overlying unexposed regions 74 of the vesicular film 72 are semi-transparent whilst those elements 76, 77 which lie on the raised regions 74 can be opaque since the underlying material forming the raised region is itself opaque or at least of high optical density. However, to avoid the need for registering the two patterns, and also to enable the incorporation of information items as discussed below, it is most preferred that all of the colour elements 76, 77, 78 are semi-transparent.

In this case, the device will exhibit effects much like those described with reference to the FIG. 6 embodiment above. When the device is viewed in reflection from an on-axis position (observer (i)), the three colour repeating pattern of side-by-side elements 76, 77, 78 (e.g. fine lines) will appear to the eye as all one colour which is the combination of the colours of the three pattern elements. When the device is viewed at a first angle (observer (ii)), the colour of the elements 77 carried by the right flank surfaces of the raised regions 73 will dominate—in this case, blue. When the device is viewed at a second angle (observer (iii)), the colour of the elements 76 carried by the left flank surfaces of the raised regions 73 will dominate—in this case red. When the device is viewed in transmission from either side (observer (iv)), due to the substantially opaque nature of the regions 73, the colour of the elements 78 applied to the intervening regions 74 will be seen. Thus four different colours are attainable from a single device.

Figure 9A:
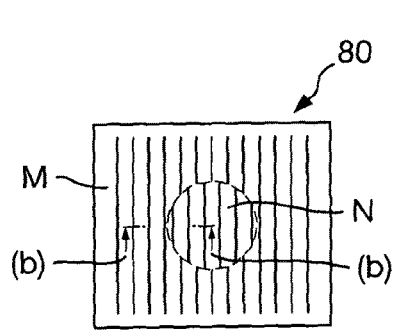

Devices such as those described in the above embodiments can be applied in the form of a colour-changing block or other shape. However, to further enhance the security level of the device, one or both of the patterns $P_1$ and $P_2$ can be adjusted to incorporate an item of information. This can be achieved using a similar technique to that described above with respect to FIG. 2. For instance, FIG. 9 depicts an embodiment of a security device 80 exhibiting an item of information in the form of a circle. As shown in FIG. 9(a), one or other of the patterns $P_1$ and $P_2$—here the pattern formed by a colour layer 86—is divided into two areas M and N. The elements making up the pattern differ in some parameter in area M relative to those in area N, but preferably have the same pitch or periodicity in both areas. In this example, the pattern in area N is offset (e.g. out of phase) with that in area M but in other cases, the pattern elements could have an angular displacement (e.g. line elements which are orthogonal to those in the other area) or, where it is the relief pattern that contains the information item, the height of the elements could be altered or the elements could be omitted entirely.

Figure 9B:
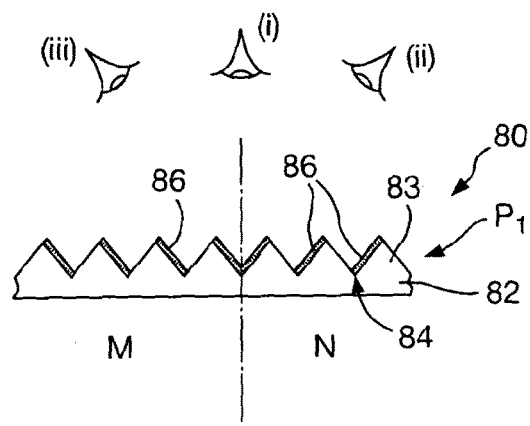

FIG. 9(b) shows a cross-section along the line (b)-(b) in FIG. 9(a) and it will be seen that here the device 90 comprises a transparent relief pattern $P_1$ formed in layer 82, e.g. by cast-curing. In this example, the raised elements 83 are line elements with a triangular cross section and the intervening portions 84 are of near zero width, amounting to the line of intersection between adjoining raised regions 83. Coloured elements 86 forming pattern $P_2$ follow the contours of the relief $P_1$ and in this case are spaced by print-free areas although a second set of colour elements in a second colour could be applied. In the region M, the colour elements 86 lie on the right flank surface of each raised region 83. In contrast, in the region N, the coloured elements 86 sit on the left flank surfaces since here the pattern $P_2$ is out of phase with that in region M. The result is that, when the device is viewed from an on-axis position, the circle defined by region N will be largely concealed, since the whole area of the device 80 will have the same overall colour which is a faded hue of the colour of elements 86. However, when the device is tilted in a first direction (observer (ii)), the colour of region M will become intense whilst that of region N will decrease and when the device is tilted in the opposite direction (observer (iii)), the colours of regions M and N will reverse. Thus as the device is tilted, the circle will appear to undergo a contrast flip, switching from a brightly coloured circle against a light background, to a light circle against a brightly coloured background. This will be the same whichever side the device is viewed from. Of course, any other item of information, such as letters, numbers or a graphic could be formed in place of the circle shown here.

FIG. 10 shows a further example of a security device incorporating an item of information, here utilising substantially the same device structure as described with reference to FIG. 8. In this case, the relief pattern $P_1$ carries the item of information, whilst the colour layer pattern $P_2$ repeats consistently across the full area of the device. Again, two areas of the device are defined: here, areas U and V. In area U, the colour layer is aligned with the relief in such a way that red and yellow elements 86, 88 of colour layer 85 sit on flank surfaces of the raised elements 83 in a vesicular film 82, whilst blue elements 87 lie over the unexposed transparent regions 84. In area V, the vesicular film pattern is offset due to a double line spacing 2w inserted at the interface, with the result that now it is the red and blue elements 86, 87 which correspond to the flank surfaces of the relief regions and yellow elements 88 overlie the transparent regions. When the device is viewed from an on-axis position in reflection (observer (i)), the interface between areas U and V (and hence any information it defines) will be concealed since the whole area of the device will appear to have the same overall colour. However, when tilted to a first angle (observer (ii)), area U will appear predominantly red whilst area V is predominantly yellow. When tilted to a second angle (observer (iii)), area U will appear predominantly blue whilst area V will be predominantly red. When viewed in transmission, area U will appear blue whilst area V will appear yellow. Thus, the device will exhibit a colour switch as it is tilted and the information will also be revealed when viewed in transmission.

FIGS. 11(a) and (b) show two views of an exemplary security device produced using the above technique with a colour layer comprising elements of two colours (rather than three). Here, the two areas U and V collectively define a logo in the form of a silhouette. In FIG. 11(a), the device is viewed from a first angle and the silhouette U appears in a light colour relative to a darker coloured background V. In FIG. 11(b), the device is viewed from a second angle and it will be seen that the contrast between the silhouette and its background is reversed.

In all of the embodiments described above, it should be appreciated that registration between the first and second patterns $P_1$ and $P_2$ is not essential. Since the repeat distances (pitches) of both patterns are substantially equal, and the two patterns have their axes aligned with one another, each part of one pattern will consistently be aligned with the same part of the other pattern across the area of the device, unless some intentional disruption is introduced in order to provide an information item as set out above. Therefore, the desired change in appearance will be perceived as the device is tilted. Registration of the patterns however is needed if precise control over which colour (or image, in the case of the FIG. 4 embodiment for instance) is apparent at which viewing angle.

Additional effects can be introduced by adding a small pitch or rotational mismatch between the two patterns $P_1$ and $P_2$. FIGS. 12 (a) and (b) illustrate the principles but it will be appreciated that this can be applied to any of the embodiments described above with respect to FIGS. 2 to 10. In FIG. 12(a), the first pattern $P_1$ (e.g. a visible pattern or a relief pattern) has a pitch $r_1$ which is slightly offset from the pitch $r_2$ of the second pattern $P_2$ (e.g. formed of colour elements). When viewed from an on-axis position, there will be no overall effect since no one colour will be predominant. However, when viewed at an angle, moiré bands of colours (here labelled "A, B, C") will be exhibited due to the alignment between the patterns gradually changing between different areas of the device. Depending on the colours provided in the colour layer, this can appear as a rainbow effect. It will be appreciated that if there is too great a mismatch between the patterns, there will be no moiré effect and/or the bands will be spaced very widely apart. Therefore it is preferred that the two pitches are within about 25% of one another.

Similarly, moiré bands of colours can be produced by inserting a small rotational misalignment between the patterns and this is depicted in FIG. 12(b). Here, the first pattern $P_1$ is taken to represent a pattern with zero rotation. The second pattern is rotated relative to the first by an angle θ which is no more than 45 degrees and preferably 10 degrees or less. The resulting bands of colour are at a third angle.

The "magnification" of the moiré bands (i.e. the ratio of their apparent width to the line width of the colour pattern elements) and their angle of rotation (relative to the colour pattern) can be found using the following equations (from "The Moire magnifier", M. Hutley, R Hunt, R Stevens & P Savander, Pure Appl. Opt. 3 (1994) pp. 133-142):

$$\text{magnification, } m = \frac{a}{[(b\cos\theta - a)^2 + (b\sin\theta)^2]^{1/2}}$$

$$\text{Rotation, } \sin\phi = \frac{-b\sin\theta}{[(b\cos\theta - a)^2 + (b\sin\theta)^2]^{1/2}}$$

Where φ=angle of magnified image with respect to the lens array, a=pitch of colour pattern $P_2$, b=pitch of relief or masking pattern $P_1$ and θ=angle between the 2 array orientations.

In the majority of the above embodiments, the two patterns $P_1$ and $P_2$ are formed of line elements. However, any shape of high optical density or relief regions could be used to form the first pattern in an at least semi-transparent layer and similarly the colour elements could take any appropriate shape. FIG. 13 shows a further embodiment of a security device comprising a relief pattern $P_1$ formed on a transparent layer 102 with an overlying colour layer 105. Here the raised regions 103 are "point" or "island" type regions with a dome-like shape spaced by intervening flat regions 104. In alternative embodiments, conical, pyramidal or any other shaped elements could be used instead. In the present case there are no predefined edges delimiting the flank surfaces of the raised regions 103 from one another and it will be appreciated that any number of flank surfaces could in fact be defined through design of the applied colour layer. Here, each raised region 103 is defined into four effective flanks through the application of colour elements 106, 107, 108 and 109 in a repeating pattern. Each element has a triangular shape, the apexes of which are preferable registered to the centre of each raised region (although this is not essential). In this example, only two of the four colour elements are depicted as possessing a colour (elements 107 and 109), but more or fewer elements could be coloured. When viewed from an on-axis position, the device will have an overall colour defined by the combination of the four coloured elements, whereas when viewed from an angle, one (or a selection) of the colours will dominate. If the raised areas are also of high optical density (e.g. formed in a vesicular film), another colour could be arranged to be exhibited when the device is viewed in transmission by arranging the flat regions 104 of the device to carry a different colour (or a different assortment of colours) from those on the raised areas.

Exemplary methods of manufacturing the above-described security devices will now be described.

Figure 14B:
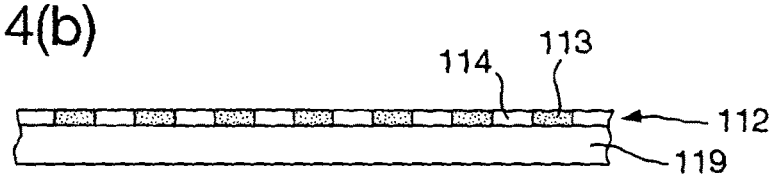
Figure 14C:
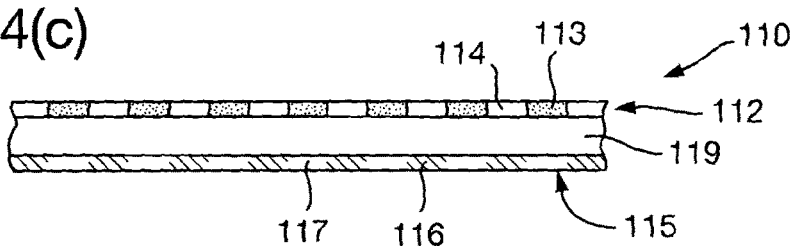

FIG. 14 depicts steps in a process for forming a security device with a visible pattern in a vesicular film, as used for example in the embodiments of FIGS. 1 to 4 above. A vesicular film 112 is provided on a transparent support layer 119 such as PET or BOPP. As shown in FIG. 14(*a*), the vesicular film is exposed to radiation 155 of a wavelength to which the vesicular film is responsive (e.g. UV radiation) through a mask 150 defining a pattern of elements 151 which are substantially opaque to the radiation 155 and elements 152 which are at least semi-transparent. For instance, this step can be achieved using any of the apparatus and methods disclosed in our International patent application no. PCT/GB2012/052520, the vesicular film 112 and support layer 119 corresponding to the substrate web described therein.

The exposure causes regions 113' of the vesicular film to release gas atoms or molecules internally within the film structure and, although marked in FIG. 14(*a*), this will not yet be visible. The pattern is developed by heating the vesicular film, again as described in our International patent application no. PCT/GB2012/052520, which causes the released gas to collect and form bubbles (vesicles), either at the same time as exposing the film to the radiation or subsequently. This results in an increase in the optical density of the exposed regions to form a pattern of visible, relatively dark regions 113 (dark when viewed in transmission) and unexposed regions 114 which remain at least semi-transparent, as shown in FIG. 14(*b*). The pattern may also exhibit a surface relief, but this is not essential in the present embodiment.

In one example, the vesicular film could be a 5 μm layer of "vesicular microfilm" supplied by Exopack Advanced Coatings of Matthews, N.C., USA. The film may be exposed through the mask to approximately 100 mJ of UV radiation and heated at about 70° C. for around 30 seconds. These processing parameters have been found to produce a suitable increase in optical density with little or no surface relief arising. However, the exposure and heating parameters can be adjusted as required in order to achieve the desired effect.

A colour layer 115 can then be applied to the opposite surface of support layer 119, e.g. by printing, coating, lamination or metallisation as previously described. The colour layer is preferably patterned, comprising colour elements 116, 117 of at least one colour. The resulting security device 110 is shown in FIG. 14 (*c*).

In variations of this method, the colour layer 115 could be applied to the support layer 119 before the vesicular film is exposed to the patterned radiation, or between exposure and heating. If applied before exposure, the colour layer 115 could itself act as a mask, the vesicular film being exposed to appropriate radiation through the colour layer 115 and transparent layer 119. In further variations, the transparent layer 119 could be omitted if the vesicular film is self-supporting.

Figure 15B:
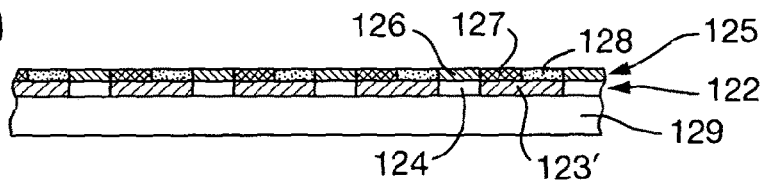
Figure 15C:
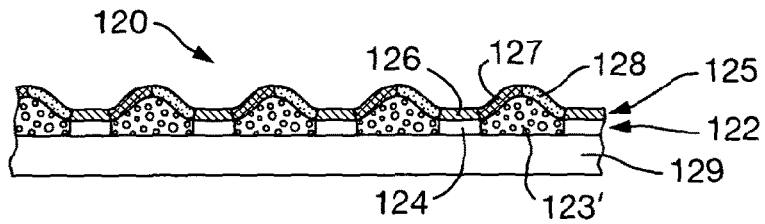

FIG. 15 depicts steps in a second exemplary process for manufacturing a security device which in this case comprises a relief pattern formed in a vesicular film. For instance, this process could be used in the manufacture of any of the devices described above with reference to FIGS. 7, 8 and 10.

Again, a vesicular film 122 is provided on a support layer 129 which is preferably transparent (although here this is not essential): for instance, the layer 129 could be a polymer film such as PET or BOPP but could alternatively be a document substrate, such as paper or card. As in the FIG. 14 example, the vesicular film 122 is exposed to an appropriate wavelength of radiation 165 through a mask 160 carrying a pattern of opaque and non-opaque regions 161, 162, resulting in exposed regions 123' of the vesicular film.

Next, before heating takes place, a colour layer 125 is applied to the surface of exposed vesicular film 122, as shown in FIG. 15(*b*). As previously described, the colour layer can be applied using any technique including printing, coating, metallisation and laminating. Preferably, the colour layer 125 takes the form of a print and is applied using gravure or lithographic techniques. However, many other printing techniques including ink jet, screen printing or dye diffusion thermal transfer printing could be used instead. In the present example, the colour layer comprises a pattern of elements 126, 127, 128 in three colours although more or fewer colours could be adopted as previous described. The colour layer may be opaque, semi-transparent or a mixture thereof as already explained.

The structure is then heated to develop the exposed pattern in vesicular film 122, resulting in raised regions 123 which are also of relatively high optical density relative to the intervening regions 124. The colour layer 125 already applied to the surface of the vesicular film now follows the contours of the relief, as shown in FIG. 15(*c*). Security device 120 is thus complete.

Suitable processing parameters for producing relief in a vesicular film in this way are disclosed in detail in our International patent application no. PCT/GB2012/052520. In one example, the vesicular film could be a 5 μm layer of film supplied by Exopack Advanced Coatings of Matthews, N.C., USA. The film may be exposed through the mask to 100 mJ of UV radiation and heated at about 120° C. for around 30 seconds. These processing parameters have been found to produce a suitable increase in optical density and surface relief. However, the exposure and heating parameters can be adjusted as required in order to achieve the desired effect. Optionally, after the relief pattern has been developed, the film may be deactivated by exposing the film to UV radiation for a second time and then maintaining the film at temperatures below those at which gas migration is promoted for a period of time, e.g. less than 70 degrees C. for at least two hours. This allows the gas released by the second exposure to leach out of the film without forming bubbles, after which the film will be substantially non-responsive to further exposure and heating cycles.

In variations of this embodiment, the colour layer 125 could be applied to the vesicular film 122 before the vesicular film is exposed to the patterned radiation. For example, if the support layer 129 is at least semi-transparent to the appropriate radiation wavelength, the vesicular film could be exposed through the support layer 129 with the colour layer in situ. Alternatively, the colour layer 125 itself could act as a mask (in place of mask 160) during the patterning of the vesicular film 122, if selected elements 126 of the colour layer are substantially opaque to the wavelength of radiation to which the vesicular film is responsive whilst other elements 127, 128 are at least semi-transparent to the radiation. In this way, the pattern in vesicular film 122 will be precisely registered to the colour layer pattern. The wavelengths of radiation to which the vesicular film is responsive preferably lie primarily outside the visible spectrum (e.g. UV or UV+violet light) and so the element(s) of colour pattern 125 which are substantially opaque to the radiation used to pattern the vesicular film are not necessarily visibly opaque, and vice versa. For example, elements 126 in the present example could be substantially opaque to UV radiation whilst retaining a visually semi-transparent appearance. This could be achieved by adding a UV absorbing substance such as Tinuvin 326™ or Tinuvin P™ by BASF plc to otherwise semi-transparent inks.

Techniques such as that illustrated in FIG. 15 provide the substantial benefit that the colour layer 125, which ultimately follows the contours of a surface relief, is applied (e.g. printed) onto a substantially flat surface. This makes it possible to use a wide range of conventional printing, coating, laminating etc methods for forming the colour layer, many of which could not be successfully applied to a surface already exhibiting a relief profile where in particular it is difficult to achieve consistent coating in the "valley" regions (i.e. non-raised portions) of the relief. This not only significantly simplifies the manufacturing process but also results in a higher quality product with improved visual effect.

Figure 16B:
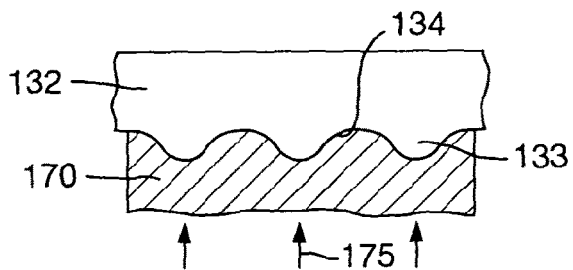

FIG. 16 illustrates steps in a third embodiment of a process for manufacturing a security device. In this case, an at least semi-transparent relief pattern is to be formed and hence use of a vesicular film is not appropriate. An uncured polymer layer 132 such as a resin formulation (e.g. a composition of 50 to 55% TPGDA (Tripropylene Glycol Diacrylate), 5 to 15% DPGDA (Dipropylene Glycol Diacrylate) and 30% DPHA (Dipentaerythrytol hexaacrylate)) is provided and this may take the form of a coating on a support substrate (not shown). The uncured polymer 132 comprises a photo-initiator substance which is responsive to radiation of a known wavelength, such as UV radiation. For instance, 2.5% (w/w) Irgacure 651™ from BASF may be added to the above resin formulation as a photoinitiator. A mould 170 carrying a relief pattern 171 in its surface is applied to the polymer layer 132 to thereby cast the relief pattern into the polymer layer, forming raised regions 133 and non-raised portions 134 as shown in FIG. 16(b). The mould 170 is at least semi-transparent to the radiation to which the photo-initiator contained in layer 132 is responsive, and whilst the mould is impressed into layer 132, radiation of the appropriate wavelength is irradiated through the mould. The polymer layer 132 is thereby cured and retains the relief pattern when the mould is removed. Techniques of this sort are generally referred to as cast-curing and are further described, for example, in WO-A-2008/061930 along with examples of suitable materials which may be used to form layer 132.

Figure 16C:
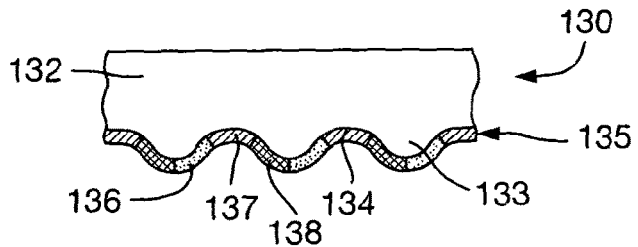

Finally, as shown in FIG. 16(c), a colour layer 135 is applied to the relief pattern formed in the surface of layer 132, using wet lithographic printing for example. In this example, the colour pattern comprises elements 136, 137, 138 in three colours as per the embodiment of FIG. 6 but as previously described, many other configuration are possible.

Additional layers or other features may be incorporated into any of the security device structures described above. In particular, where the security device includes a vesicular film, the security device preferably includes at least one shielding layer for protecting the vesicular film from further exposure to wavelengths of radiation to which it is responsive, such as UV. For instance, a UV absorbing lacquer may be applied to one or both sides of the device, or incorporated within the above described structures. Alternatively, if the vesicular film is provided on a support layer (e.g. layers 9, 19, 39, 79, 119, 129 mentioned above), that support layer could be substantially opaque to the appropriate wavelength and/or the colour layer could be substantially opaque to the appropriate wavelength (whether or not it is also substantially opaque in the visible spectrum). In other cases, such shielding components could instead be provided as part of an object of value (e.g. a document of value) into which the security device is ultimately incorporated. Such shielding components may be used instead of or in addition to the deactivating process steps mentioned above.

The device could also include features such as luminescent, fluorescent or thermochromic substances which could be incorporated into the colour layer or could be applied separately. Magnetic features could also be incorporated, e.g. in the form of magnetic inks in the colour layer or elsewhere. Colour shifting materials such as interference film structures, cholesteric liquid crystal layers or pigments, interference pigments and/or pearlescent pigments could also be used.

It is also preferred that the device is arranged to be machine-readable. This may be achieved in a number of ways. For example at least one layer of the device (optionally as a separate layer) may further comprise machine-readable material. Preferably the machine-readable material is a magnetic material, such as magnetite. The machine-readable material may be responsive to an external stimulus. Furthermore, when the machine-readable material is formed into a layer, this layer may be transparent. Detectable materials that react to an external stimulus include but are not limited to fluorescent, phosphorescent, infrared absorbing, thermochromic, photochromic, magnetic, electrochromic, conductive and piezochromic materials.

The presence of a coloured layer (particularly when it is used to provide background colour as in FIG. 1 and FIGS. 21 to 23) can be used to conceal the presence of a machine readable dark magnetic layer. When a magnetic material is incorporated into the device the magnetic material can be applied in any design but common examples include the use of magnetic tramlines or the use of magnetic blocks to form a coded structure. Suitable magnetic materials include iron oxide pigments ($Fe_2O_3$ or $Fe_3O_4$), barium or strontium ferrites, iron, nickel, cobalt and alloys of these. In this context the term "alloy" includes materials such as Nickel:Cobalt, Iron:Aluminium:Nickel:Cobalt and the like. Flake Nickel materials can be used; in addition Iron flake materials are suitable. Typical nickel flakes have lateral dimensions in the range 5-50 microns and a thickness less than 2 microns. Typical iron flakes have lateral dimensions in the range 10-30 microns and a thickness less than 2 microns.

In addition if the coloured layer is a highly reflective layer such as a vapour deposited metallised layer then it could be used as a reflection enhancing layer for a holographic generating structure which would provide the device with an additional security feature. The holographic generating structures can be in the form of holograms or DOVID (Diffractive Optical Variable Image Device) image elements. The holographic image structures are cast or embossed into a polymeric resin or lacquer applied onto the metal layer as with a conventional holographic device. For example in the embodiment described in FIG. 2 if the coloured layer takes the form of a metal layer combined with a holographic structure then the microtext will be observed against a holographic background.

The disclosed security devices can be utilised in numerous ways. Two primary options are: (i) the security device can be processed into a security article, such as a label, foil or thread; and (ii) the security device can be formed directly on or as part of an object of value, such as a banknote.

For example, the security device may be formed on a substrate web which is then cut into individual security articles such as threads, strips or labels which can then be individually incorporated into or applied to objects of value. Alternatively the whole length of the web may itself constitute a security article, and could be applied to or incorporated into one or more objects of value (e.g. a web of such objects) without the need for any further processing steps. Examples of how such security articles may be incorporated into objects of value will now be described with reference to FIGS. 17 to 19.

Security threads are now present in many of the world's currencies as well as vouchers, passports, travellers' cheques and other documents. In many cases the thread is provided in a partially embedded or windowed fashion where the thread appears to weave in and out of the paper. One method for producing paper with so-called windowed threads can be found in EP0059056. EP0860298 and WO03095188 describe different approaches for the embedding of wider partially exposed threads into a paper substrate. Wide threads, typically with a width of 2 to 6 mm, are particularly useful as the additional exposed area allows for better use of overt security features such as those formed using the presently disclosed techniques.

FIG. 17 shows an embodiment of an object of value, here a document of value 200 such as a banknote, into which a security article 250 constituting a length of substrate web bearing at least one security device is incorporated. The substrate web may be cut into individual security threads 250 before insertion into the security document 200 but in preferred embodiments, a reel of the processed substrate web may be fed into a paper-making process, for example, to form a web of documents which is then cut into individual documents of the appropriate size. Here, the thread 250 is incorporated as a windowed thread in between first and second plies 200*a* and 200*b* of the security document 200, at least one of the plies 200*a* having a series of windows 201 formed therein either during the paper-making process or subsequently (e.g. by grinding). The windows 201 thereby reveal portions of the security article 250 such that the device 260 carried by the substrate web is observable through the windows 201. Between the windows 201, sections of the thread 202 are concealed by the overlying document ply 200*a*. Alternatively, the windowing thread could be incorporated into single ply paper and produced using the method described in EP0059056.

FIG. 18 shows an alternative embodiment of a document of value 200, in which a substrate web is formed into strip articles 250 which are mounted to one side of a document substrate 200*a* in alignment with a window 201 which may be formed before or after application of the strip 250. A security device is observable through the window 201 and, depending on the construction of the security element and substrate web, it may be visible from the other side of the document 200 also. The strip 250 can be affixed to document ply 200*a* using an adhesive for example. As in the case of the security thread, cutting of the substrate web into individual strips 250 may take place before or after incorporation with the document substrate 200*a*.

The security document 200 may have a substrate formed from any conventional material including paper and polymer. Techniques are known in the art for forming transparent regions in each of these types of substrate. For example, WO8300659 describes a polymer banknote formed from a transparent substrate comprising an opacifying coating on both sides of the substrate. The opacifying coating is omitted in localised regions on both sides of the substrate to form a transparent region.

EP1141480 describes a method of making a transparent region in a paper substrate. Other methods for forming transparent regions in paper substrates are described in EP0723501, EP0724519, EP1398174 and WO03054297.

FIG. 19 shows a further embodiment in which a substrate web has been formed into label articles 250 and affixed to a surface of a document 200. Here, the document substrate 200 may be opaque (e.g. paper), transparent or translucent (e.g. polymer substrate), or some combination thereof. For instance, the document substrate 200 could be transparent in the vicinity of the label 250 and substantially opaque elsewhere. The label element could be formed as a sticker which is peeled off a carrier backing sheet before application to the document or could take the form of a transfer element released from a carrier web by hot stamping, for example.

If the security device is to be used in a label application it will typically require the application of a heat or pressure sensitive adhesive to the outer surface of the device which will contact the secure document. In addition an optional protective coating/varnish could be applied to the exposed outer surface of the device. The function of the protective coating/varnish is to increase the durability of the device during transfer onto the security substrate and in circulation.

In the case of a transfer element rather than a label, the security device is preferably prefabricated on a carrier substrate and transferred to the substrate in a subsequent working step. The security device can be applied to the document using an adhesive layer. The adhesive layer is applied either to the security device or the surface of the secure document to which the device is to be applied. After transfer the carrier strip can be removed leaving the security device as the exposed layer or alternatively the carrier layer can remain as part of the structure acting as an outer protective layer. A suitable method for transferring security devices based on thick devices comprising micro-optical structures is described in EP1897700.

In each of the above examples, the security article carries the complete security element prior to incorporation into an object of value. However, this is not essential. For example, a security article such as a thread may be provided carrying the first pattern only (e.g. a vesicular film pattern with or without relief, or a relief pattern formed in a transparent layer) and incorporated into an object of value, such as a banknote, using any of the aforementioned techniques. The colour layer could already be incorporated into the object of value—for instance, in the form of a patterned portion of a document substrate, the security article being applied over the top of that portion—or the colour layer could then be applied to the security article once in situ. For example, the security article could provide a relief pattern only (e.g. formed in a vesicular film) and, once applied to or incorporated into an object of value a colour layer can be applied across a portion of the relief pattern to form the security device. The security article could comprise an exposed but unheated vesicular film which once incorporated into the object of value is printed and then heated.

Figure 20A:
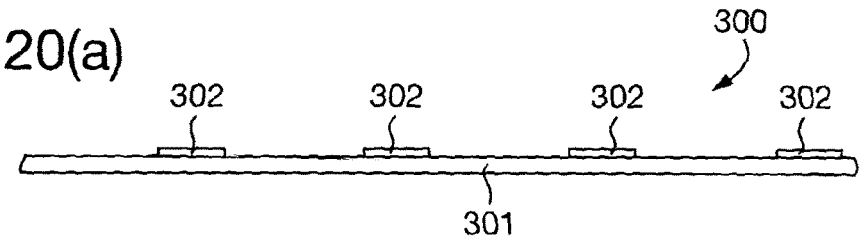
Figure 20B:
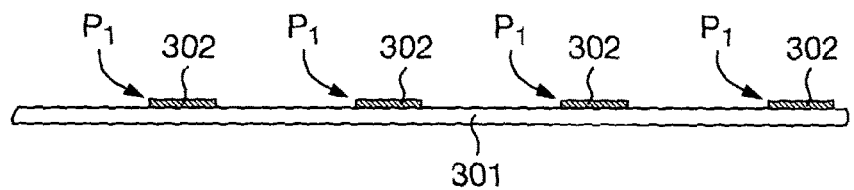
Figure 20C:
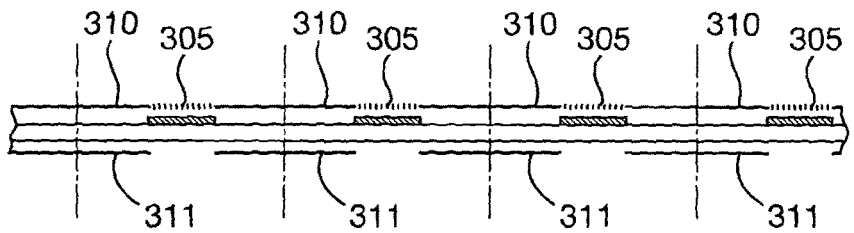
Figure 20D:
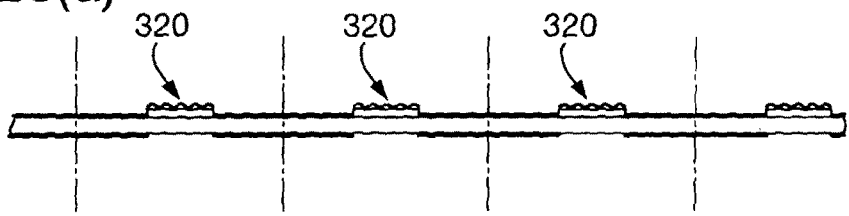
Figure 20E:
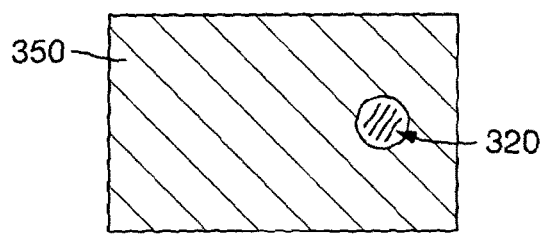

In another example, both patterns can be formed directly on an object of value. FIG. 20(a) depicts a section of a substrate web 300 comprising a support layer 301 with isolated regions of vesicular film 302 applied thereon. Here, the support layer 301 is a conventional document substrate material such as a polymer banknote substrate or paper. The support layer 301 may or may not be pre-printed and may or may not already carry one or more additional security devices such as magnetic threads. The vesicular film is processed as described above with reference to FIG. 15 such that a pattern $P_1$ is transferred into each vesicular film portion 302. However, preferably the film is not yet heated such that any surface relief is not yet developed. The result is shown in FIG. 20(b). The support layer 301 is then printed or coated on one or both sides with layers 310/311 which omit the vesicular film portions 302 and a region of the opposite side of the support layer 301 such that a window is formed surrounding each vesicular pattern $P_1$ (assuming the support layer 301 is visually transparent or translucent). Within each window, a patterned colour layer 305 is provided over each vesicular film portion 302, and this may be an extension of print 310. The assembly is then heated to develop the vesicular film pattern and produce the desired surface relief. The resulting security elements 320 are depicted in FIG. 20(d). The web can be cut into individual documents of value such as bank notes before or after heating and one such document 350 is illustrated in FIG. 20(e), carrying a security device 320 thereon. One or more shielding layers which are visually transparent but block radiation to which the vesicular film is responsive will typically also be provided as discussed above.

FIGS. 21, 22 and 23 show three further examples of security device in accordance with aspects of the present invention. Here, the colour layer provides background colour(s) to a secure visual effect generated by overlying (or underlying) layers, as is the case in the FIG. 1 embodiment.

FIG. 21 depicts a security device 400 comprising two vesicular films 401, 402 separated by a transparent layer 409 and each exhibiting a pattern $P_1$, $P_2$ of relatively high optical density regions. In a first area A of the device, the patterns in the two vesicular films are aligned whereas in a second area B of the device, the patterns are out of phase. Techniques and apparatus particularly well adapted for forming structures with two vesicular films such as this are disclosed in our International patent application no. PCT/GB2012/052520. A colour layer 405 is applied to one of the vesicular films 402 and may or may not itself carry a pattern. When viewed from above vesicular film 401, the device exhibits a venetian blind effect which differs in regions A and B. When viewed from an on-axis position (observer (i)), region A will appear to possess the colour provided by colour layer 405 since portions of that layer are visible through the two vesicular film patterns, whereas in region B, the colour layer will be masked by the interaction of the two offset patterns. When viewed from an angle (observer (ii)), the effect will be reversed.

FIG. 22 depicts a moiré interference device 420, again comprising two vesicular films 421, 422 each carrying a line pattern $P_1$, $P_2$, which are illustrated schematically alongside. A colour layer 425 is applied to one of the vesicular films 422. The two patterns are provided with a mismatch which could be a pitch mismatch but in this case is a small angular rotation of one pattern relative to the other. When viewed from above vesicular film 421, moiré bands will be visible due to interference between the two patterns. In this example the bands will consist of dark stripes visible against a coloured background provided by colour layer 425, although more complex effects can be generated through design of the two line patterns. When the device is tilted, the moiré bands will appear to move and if colour layer 425 is patterned, this movement will appear to be relative to the colour layer pattern, which provides a particularly distinctive visual effect. The apparent band movement is due to different portions of the two patterns $P_1$, $P_2$ becoming aligned when the device is tilted, as illustrated by observers (i) and (ii) in the Figure. Depending on the parameter of the colour layer pattern, a colour change may also be perceived. For instance, where the colour layer pattern comprises bands of red and blue, at certain angles both may be visible alongside one another through the two patterns $P_1$, $P_2$. However, when the device is tilted, the two patterns together may block one of the bands such that the device appears to switch colour from purple to either blue or red.

FIG. 23 shows a security device 440 which incorporates an array of focussing elements, such as microlenses, e.g. an array of spherical or cylindrical lenses formed for example in a separate cast-cure process, and a visible pattern formed on a vesicular film 442, spaced by a transparent layer 449 such that the pattern is located in the focal plane of the focussing elements. This type of structure can be used to form a lenticular device or a moiré magnification device. A colour layer 445 is applied to the vesicular film, which may be patterned or carry a single block colour.

In a lenticular device, when viewed through the microlens array 450, the device exhibits a focused version of the pattern exhibited by vesicular layer 442, with a coloured background provided by the colour layer 445. Depending on the design of the pattern on vesicular film 442, the focussed image could be substantially the same at all different viewing positions. However, in preferred examples, the pattern formed on vesicular layer 442 comprises interleaved portions of more than one image in much the same way as described above with reference to the FIG. 4 embodiment. In this way, when viewed from above the microlens array from a first viewing position, only portions of a first image will be focussed, whereas when viewed from a second viewing position, portions of a second, different, image will be focussed. The result is a device which exhibits a focussed, coloured image which appears to switch appearance and preferably colour when the device is tilted beyond a certain angle. The device could be a one-dimensional lenticular device, whereby the switch effect is only perceived when the device is tilted about one axis. In this case, the lens array could consist of cylindrical lenses and the interleaved image portions may be slices (as in the FIG. 4 embodiment). Alternatively, a two-dimensional effect could be achieved, whereby the switch is visible when the device is tilted about either of the axes lying in the plane of the device, utilising for example spherical lenses and a "checkerboard" array of image elements.

As in previous embodiments, the aspect ratio of the distance between lens array 450 and the vesicular film 442 (here, the focal length f) to the spacing, $s_1$, between the pattern elements on vesicular film 442 determines the angle at which the switch will be perceived. The higher the ratio of f:s, the smaller the change in viewing angle necessary in order to perceive the change in images. Therefore, forming the pattern elements on a vesicular film enables the spacing s to be reduced (due to the high resolution that is achievable) to a level far out-performing that achievable using conventional patterning techniques such as printing. This either can be utilised to obtain a higher aspect ratio of f:s without substantially changing the thickness of the device, leading to an enhanced optical effect, or to permit a reduction in the thickness of the device (provided lenses of suitable focal length are available) whilst still achieving a high impact optical switch.

Of course, the lenticular device could be configured to carry multiple sequential images if desired, thus appearing as an animated feature as in the FIG. 4 embodiment.

Alternatively, the pattern on vesicular film 442 can be configured to produce a moiré magnification effect, the principles of operation of which are described in our International Patent Application Number PCT/GB2011/050398. In this case, the pattern carried by the vesicular film 2 comprises an array of microimage elements. The microlenses have a pitch $r_2$ which differs from the pitch $r_1$ of the microimage array. This pitch mismatch gives rise to a magnification effect whereby each lens magnifies a different portion of the neighbouring microimage array elements, thereby forming in combination a magnified version of the array on a virtual image surface which appears in front of or behind the device, with a coloured background due to the colour layer 445. The degree of magnification achieved depends on the degree of pitch mismatch between the arrays.

As the device is tilted, different portions of each microimage element become magnified, and the magnified image panel therefore appears to move relative to the security device. Various additional effects can be achieved through design of the pattern to which the vesicular film 2 is exposed, and examples of such effects and suitable microimage arrays through which they can be achieved are disclosed in our International patent application number PCT/GB2011/050398.

It should be noted that it is not essential that the microlens and microimage arrays have differing pitches. Instead, a suitable mismatch between the two arrays can be achieved by rotating one array relative to the other, which will also give rise to moiré magnification.

Lenticular and moiré magnification devices such as that depicted in FIG. 23 may alternatively be formed using focussing mirror arrays in place of the described microlens arrays 450. In this case, the array of mirrors would be disposed underneath the exposed vesicular film 442 and the colour layer 425 must be semi-transparent.

The invention claimed is:

1. A security device, comprising:
   an at least semi-transparent layer exhibiting a first pattern of integral regions having a raised surface profile relative to intervening regions of the layer, the first pattern comprising raised regions each having at least two flank surfaces that are non-parallel to a plane of the device, and the material of the raised regions being of high optical density relative to the material of the intervening regions of the layer; and
   a colour layer arranged to follow the contours of the integral regions and exhibiting a second pattern comprising elements of at least two different colours, the second pattern being configured such that (i) at least two of the flank surfaces of each raised region exhibit different colour appearances and (ii) at least elements of the second pattern corresponding to the intervening regions of the first pattern are semi-transparent;
   wherein the first and second patterns at least partially overlap one another and are configured such that:
   when the device is viewed in reflected light from at least a first side of the device, the first and second patterns co-operate to generate an optically variable effect whereby the appearance of the device changes between a first colour and second colour at different viewing angles; and
   when the device is viewed on-axis in transmitted light, a colour is exhibited that is different from the colour exhibited by the device when viewed on-axis in reflected light from the first side of the device.

2. A security device according to claim 1, wherein the raised regions forming the first pattern are spaced by intervening, non-raised regions which are substantially transparent, and which are concealed by the raised regions to a greater or lesser extent depending on the angle of view.

3. A security device according to claim 2, wherein the second pattern is configured such that the intervening regions of the first pattern exhibit a colour appearance which is different from that or those of the raised regions.

4. A security device according to claim 1, wherein the raised regions of the first pattern and the elements of the colour layer are at least semi-transparent, whereby at some viewing angles different elements of the second pattern are perceived to overlap such that a combined colour is exhibited.

5. A security device according to claim 1, wherein the raised regions of the first pattern are at least semi-transparent and the elements of the colour layer carried on the flank surfaces of the regions are substantially opaque.

6. A security device according to claim 1, wherein the at least semi-transparent layer is a polymer layer carrying a surface relief in the form of the first pattern.

7. A security device according to claim 1, wherein the at least semi-transparent layer is an exposed photosensitive film, the regions of the first pattern corresponding to exposed regions of the photosensitive film and having an increased optical density relative to unexposed regions, the photosensitive film being adapted to exhibit an increase in optical density upon exposure to radiation of a predetermined wavelength and concurrent or subsequent heating, the increase in optical density being due to the formation of bubbles within the photosensitive film.

8. A security device according to claim 1, wherein the colour layer comprises a print, a coating, a laminate or a metallisation.

9. A security device according to claim 1, wherein the at least semi-transparent layer is an exposed photosensitive film, the regions of the first pattern corresponding to exposed regions of the photosensitive film and having an increased optical density relative to unexposed regions, the photosensitive film being adapted to exhibit an increase in optical density upon exposure to radiation of a predetermined wavelength and concurrent or subsequent heating, the increase in optical density being due to the formation of bubbles within the photosensitive film.

10. A security device according to claim 1, wherein the second pattern comprises elements of at least two colours.

11. A security device according to claim 1, wherein the colour layer comprises a print, a coating, a laminate or a metallisation.

12. A security article comprising a security device in accordance with claim 1.

13. A security article according to claim 12 wherein the security article is a thread, strip, foil, patch or label.

14. A security article according to claim 12, wherein the security article is a thread, strip, foil, patch or label.

15. An object of value comprising a security device in accordance with claim 1,
wherein the security article is a thread, strip, foil, patch or label.

16. An object of value according to claim 15, the object of value being a document of value such as a banknote, a cheque, a passport, a visa, a tax disc, an ID card, a certificate, a stamp, a ticket, a share certificate, a drivers' licence, or a certificate of guarantee.

17. A security article comprising a security device in accordance with claim 1.

18. A security article according to claim 17, wherein the security article is a thread, strip, foil, patch or label.

19. An object of value comprising a security device in accordance with claim 1.

20. An object of value according to claim 19, the object of value being a document of value such as a banknote, a cheque, a passport, a visa, a tax disc, an ID card, a certificate, a stamp, a ticket, a share certificate, a drivers' licence, or a certificate of guarantee.

21. A method of making a security device, comprising:
(a) providing an at least semi-transparent layer;
(b) modifying regions of the at least semi-transparent layer to form a first pattern of integral regions having a raised surface relief relative to intervening regions of the layer, the first pattern comprising raised regions each having at least two flank surfaces that are non-parallel to a plane of the device, and the material of the raised regions being of high optical density relative to the material of the intervening regions of the layer; and, before, during or after step (b):
(c) applying a colour layer on one side of the at least semi-transparent layer, the colour layer forming a second pattern of elements of at least two different colours following the contours of the raised surface relief, the second pattern being configured such that (i) at least two of the flank surfaces of each raised region exhibit different colour appearances and (ii) elements of the second pattern corresponding to the intervening regions of the first pattern are semi-transparent;
wherein the first and second patterns at least partially overlap one another and are configured such that:
when the device is viewed in reflected light from at least a first side of the device, the first and second patterns co-operate to generate an optically variable effect, whereby the appearance of the device changes between a first colour and a second colour at different viewing angles; and
when the device is viewed on-axis in transmitted light, a colour is exhibited which is different from the colour exhibited by the device when viewed on-axis in reflected light from the first side of the device.

22. A method according to claim 21, wherein the at least semi-transparent layer is a polymer layer, and step (b) comprises cast-curing a surface relief into the polymer layer to thereby form the first pattern.

23. A method according to claim 21, wherein the at least semi-transparent layer is a photosensitive film adapted to exhibit an increase in optical density upon exposure to radiation of a predetermined wavelength and concurrent or subsequent heating, the increase in optical density being due to the formation of bubbles within the photosensitive film, and step (b) comprises:
(b1) exposing the photosensitive film to radiation of a predetermined wavelength to which the photosensitive film is responsive through a mask defining the first pattern; and
(b2) heating the exposed photosensitive film,
whereby the optical density of the exposed regions of the photosensitive film is increased such that a reproduction of the first pattern is displayed by the photosensitive film, step (b2) optionally resulting in a raised surface profile of the exposed regions.

24. A method according to claim 21, wherein step (c) comprises printing, coating, laminating or metallising the colour layer on to the device.

25. A method according to claim 21, wherein the at least semi-transparent layer is a photosensitive film adapted to exhibit an increase in optical density upon exposure to radiation of a predetermined wavelength and concurrent or subsequent heating, the increase in optical density being due to the formation of bubbles within the photosensitive film, and step (b) comprises:
(b1) exposing the photosensitive film to radiation of a predetermined wavelength to which the photosensitive film is responsive through a mask defining the first pattern; and
(b2) heating the exposed photosensitive film,
whereby the optical density of the exposed regions of the photosensitive film is increased such that a reproduction of the first pattern is displayed by the photosensitive film, step (b2) optionally resulting in a raised surface profile of the exposed regions.

26. A method according to claim 21, wherein step (c) comprises printing, coating, laminating or metallising the colour layer on to the device.

* * * * *